United States Patent [19]
Toda

[11] Patent Number: 5,925,967
[45] Date of Patent: Jul. 20, 1999

[54] ULTRASONIC SWITCHING DEVICE

[76] Inventor: Kohji Toda, 1-49-18 Futaba, Yokosuka 239, Japan

[21] Appl. No.: 09/023,193

[22] Filed: Feb. 13, 1998

[51] Int. Cl.$^6$ .................................................... H01L 41/04
[52] U.S. Cl. ........................................ 310/313 B; 333/154
[58] Field of Search ........................... 310/313 R, 313 B; 333/193, 195, 154

[56] References Cited

U.S. PATENT DOCUMENTS

| | | | |
|---|---|---|---|
| 5,767,608 | 6/1998 | Toda | 310/313 R |
| 5,771,206 | 6/1998 | Toda | 367/118 |
| 5,798,597 | 8/1998 | Toda | 310/313 R |
| 5,838,088 | 11/1998 | Toda | 310/313 R |
| 5,850,118 | 12/1998 | Toda | 310/313 R |

*Primary Examiner*—Nestor Ramirez
*Assistant Examiner*—Peter Medley

[57] ABSTRACT

An ultrasonic switching device comprises a piezoelectric substrate, and an input- and an output interdigital transducers formed on an upper end surface of the piezoelectric substrate. The output interdigital transducer has a finger-overlap zone $R_i$ (i=1), or has N finger-overlap zones $R_i$ (i=1, 2, ..., N) and N−1 finger-overlap zones $Q_i$ {i=1, 2, ..., (N−1)} between two finger-overlap zones $R_i$ and $R_{(i+1)}$. Each finger-overlap zone $R_i$ comprises zones $R_{ia}$, $R_{ib}$ and $R_{im}$. The finger direction of the zones $R_{ia}$ and $R_{ib}$ runs parallel with that of the input interdigital transducer. The finger direction of the zone $R_{im}$ is slanting to that of the input interdigital transducer by an angle α. The finger direction of the finger-overlap zone $Q_i$ is slanting to that of the input interdigital transducer by an angle ±β. When an electric signal is applied to the input interdigital transducer, an ultrasound is excited in the piezoelectric substrate, and transduced to electric signals $E_{ia}$ and $E_{ib}$ (i=1, 2, ..., N) at the zones $R_{ia}$ and $R_{ib}$, respectively. The input- and output interdigital transducers form N pairs of ultrasound propagation lanes $Z_{ia}$ and $Z_{ib}$ (i=1, 2, ..., N), in the piezoelectric substrate, corresponding to the zones $R_{ia}$ and $R_{ib}$, respectively. If an ultrasound on an ultrasound propagation lane $Z_{Xa}$ attenuates by touching with a finger or others on the upper- or a lower end surface of the piezoelectric substrate, an electric signal $E_{Xb}$ corresponding to an ultrasound propagation lane $Z_{Xb}$ is delivered at the output interdigital transducer. In the same way, if an ultrasound on the ultrasound propagation lane $Z_{Xb}$ attenuates, an electric signal $E_{Xa}$ corresponding to the ultrasound propagation lane $Z_{Xa}$ is delivered at the output interdigital transducer, the ultrasound propagation lanes $Z_{Xa}$ and $E_{Xb}$ making a pair.

14 Claims, 12 Drawing Sheets

ULTRASONIC SWITCHING DEVICE

BACKGROUND OF THE INVENTION

1. Field of the Invention

The present invention relates to an ultrasonic switching device delivering an electric signal by touching a surface of a piezoelectric substrate.

2. Description of the Prior Art

Conventional methods for exciting an acoustic vibration on a nonpiezoelectric plate generally include a wedge-shaped transducer with a bulk wave vibrator for vibrating a nonpiezoelectric plate indirectly, or a piezoelectric thin film transducer for vibrating a nonpiezoelectric plate directly. These conventional-type transducers are applied to, for example, touch panels making use of decreasing or disappearance of output electric signal in accordance with decreasing or disappearance of an acoustic wave on a nonpiezoelectric plate when touching thereon. Such touch panels cause a high voltage operation with a high power consumption, a large-scale circuit with a complicated structure, and a difficulty on remote control. Moreover, there are some problems on manufacturing and operation frequencies.

Thus, it was difficult to apply the conventional-type transducers to a switching device delivering an electric signal by touching a surface of a piezoelectric substrate.

SUMMARY OF THE INVENTION

An object of the present invention is to provide an ultrasonic switching device capable of delivering an electric signal by touching a surface of a piezoelectric substrate with a high sensitivity and a quick response time.

Another object of the present invention is to provide an ultrasonic switching device excellent in manufacturing.

Another object of the present invention is to provide an ultrasonic switching device operating under low power consumption with low voltage.

A still other object of the present invention is to provide an ultrasonic switching device having a small-sized circuit with a simple structure which is very light in weight.

A still further object of the present invention is to provide an ultrasonic switching device capable of remote control.

According to one aspect of the present invention there is provided an ultrasonic switching device comprising a piezoelectric substrate having an upper- and a lower end surfaces running perpendicular to the direction of the thickness d thereof, and an input- and an output interdigital transducers formed on the upper end surface of the piezoelectric substrate. The input interdigital transducer has an interdigital periodicity P and an overlap length L. The output interdigital transducer has a finger-overlap zone $R_i$ (i=1), or has N finger-overlap zones $R_i$ (i=1, 2, ..., N) and N−1 finger-overlap zones $Q_i$ {i=1, 2, ..., (N−1)} between two finger-overlap zones $R_i$ and $R_{(i+1)}$. Each finger-overlap zone $R_i$ comprises a first zone $R_{ia}$, a second zone $R_{ib}$, and a third zone $R_{im}$ between the zones $R_{ia}$ and $R_{ib}$. The finger direction of the zones $R_{ia}$ and $R_{ib}$ runs parallel with that of the input interdigital transducer. An interdigital periodicity of the zones $R_{ia}$ and $R_{ib}$ is equal to the interdigital periodicity P. The finger direction of the zone $R_{im}$ is slanting to that of the input interdigital transducer by an angle α. An interdigital periodicity $P_{RN}$ along the vertical direction to the finger direction of the zone $R_{im}$ is equal to the product of the interdigital periodicity P and cos α, The zone $R_{im}$ has a first overlap length $L_{RP}$ along the finger direction thereof and a second overlap length $L_{RN}$ along the finger direction of the input interdigital transducer. The overlap length $L_{RP}$ is equal to the product of the overlap length $L_{RN}$ and sec α as well as the product of half the interdigital periodicity P and cosec α. The finger direction of the finger-overlap zone $Q_i$ is slanting to that of the input interdigital transducer by an angle ±β. An interdigital periodicity $P_{QN}$ along the vertical direction to the finger direction of the finger-overlap zone $Q_i$ is equal to the product of the interdigital periodicity P and cos β. The finger-overlap zone $Q_i$ has a first overlap length $L_{QP}$ along the finger direction thereof and a second overlap length $L_{QN}$ along the finger direction of the input interdigital transducer. The overlap length $L_{QP}$ is equal to the product of the overlap length $L_{QN}$ and sec β. The overlap length $L_{QP}$ is also equal to the product of cosec β and the interdigital periodicity P divided by twice the number N of the finger-overlap zones $R_i$. For example, if N=2, the overlap length $L_{QP}$ is not only equal to the product of the overlap length $L_{QN}$ and sec β, but also equal to the product of P/4 and cosec β.

When operating the ultrasonic switching device, an electric signal is applied to the input interdigital transducer. In this time, an ultrasound is excited in the piezoelectric substrate, and transduced to electric signals $E_{ia}$ and $E_{ib}$ (i=1, 2, ..., N), at the zones $R_{ia}$ and $R_{ib}$, respectively. The sum of the electric signals $E_{ia}$ and $E_{ib}$ is zero, because that the overlap length $L_{RP}$ is equal to the product of the overlap length $L_{RN}$ and sec α as well as the product of P/2 and cosec α. The input- and output interdigital transducers form N pairs of ultrasound propagation lanes $Z_{ia}$ and $Z_{ib}$ (i=1, 2, ..., N), in the piezoelectric substrate, corresponding to the zones $R_{ia}$ and $R_{ib}$, respectively. If an ultrasound on an ultrasound propagation lane $Z_{Xa}$ of the ultrasound propagation lanes $Z_{ia}$ attenuates by touching with a finger or others on the upper- or the lower end surface of the piezoelectric substrate, an electric signal $E_{Xb}$ corresponding to an ultrasound propagation lane $Z_{Xb}$ of the ultrasound propagation lanes $Z_{ib}$ is delivered at the output interdigital transducer, the ultrasound propagation lanes $Z_{Xa}$ and $Z_{Xb}$ making a pair. If the ultrasound on the ultrasound propagation lane $Z_{Xb}$ attenuates by touching on the upper- or the lower end surface of the piezoelectric substrate, an electric signal $E_{Xa}$ corresponding to the ultrasound propagation lane $Z_{Xa}$ is delivered at the output interdigital transducer. As a result, the choice of touch-positions on the upper- or the lower end surface of piezoelectric substrate gives the favorite output electric signal $E_{ia}$ or $E_{ib}$ at the output interdigital transducer. Thus, the ultrasonic switching device has a switching ability. If the electric signals $E_{ia}$ and $E_{ib}$ have radio frequencies, it is possible to radiate the electric signal $E_{ia}$ or $E_{ib}$ from the output interdigital transducer, causing a switching operation under remote control.

According to another aspect of the present invention there is provided an ultrasonic switching device comprising a piezoelectric substrate having an upper- and a lower end surfaces running perpendicular to the direction of the thickness d thereof, and an input- and an output interdigital transducers formed on the upper end surface of the piezoelectric substrate. The input interdigital transducer has N finger-overlap zones $A_i$ (i=1, 2, ..., N) and N−1 finger-overlap zones $B_i$ {i=1, 2, ..., (N−1)} between two finger-overlap zones $A_i$ and $A_{(i+1)}$. The output interdigital transducer has N+1 finger-overlap zones $C_i$ {i=1, 2, ..., (N+1)} and N finger-overlap zones $D_i$ (i=1, 2, ..., N) between two finger-overlap zones $C_i$ and $C_{(i+1)}$. The finger direction of the finger-overlap zones $A_i$ runs parallel with that of the finger-overlap zones $C_i$. The finger direction of the finger-overlap zones $B_i$ is slanting to that of the finger-overlap zones $A_i$ by an angle $\beta$. An interdigital periodicity $P_{BN}$ along the vertical direction to the finger direction of the finger-overlap zones $B_i$ is equal to the product of $\cos \beta$ and an interdigital periodicity P of the finger-overlap zones $A_i$ and $C_i$. Each finger-overlap zone $B_i$ has a first overlap length $L_{BP}$ along the finger direction thereof and a second overlap length $L_{BN}$ along the finger direction of the finger-overlap zones $A_i$. The overlap length $L_{BP}$ is equal to the product of $\sec \beta$ and the overlap length $L_{BN}$. The overlap length $L_{BP}$ is also equal to the product of $\csc \beta$ and the interdigital periodicity P divided by twice the number N of the finger-overlap zones $A_i$. For example, if N=2, the overlap length $L_{BP}$ is not only equal to the product of the overlap length $L_{BN}$ and $\sec \beta$, but also equal to the product of P/4 and $\csc \beta$. The finger direction of the finger-overlap zones $D_i$ is slanting to that of the finger-overlap zones $C_i$ by an angle $\alpha$. An interdigital periodicity $P_{DN}$ along the vertical direction to the finger direction of the finger-overlap zones $D_i$ is equal to the product of $\cos \alpha$ and the interdigital periodicity P. Each finger-overlap zone $D_i$ has a first overlap length $L_{DP}$ along the finger direction thereof and a second overlap length $L_{DN}$ along the finger direction of the finger-overlap zones $C_i$. The overlap length $L_{DP}$ is equal to the product of $\sec \alpha$ and the overlap length $L_{DN}$ as well as the product of half the interdigital periodicity P and $\csc \alpha$ that is the product of P/2 and $\csc \alpha$.

When operating the ultrasonic switching device, an electric signal is applied to the input interdigital transducer. In this time, an ultrasound is excited in the piezoelectric substrate, and transduced to N electric signals $E_{ia}$ (i=1, 2, . . . , N) and N electric signals $E_{ib}$ (i=1, 2, . . . , N), respectively. The sum of the electric signals $E_{ia}$ and $E_{ib}$ is zero, because that the overlap length $L_{DP}$ is equal to the product of $\sec \alpha$ and the overlap length $L_{DN}$ as well as the product of P/2 and $\csc \alpha$. The input- and output interdigital transducers form N pairs of ultrasound propagation lanes $Z_{ia}$ and $Z_{ib}$ (i=1, 2, . . . , N) in the piezoelectric substrate, an ultrasound propagation lane $Z_{ia}$ existing between the finger-overlap zones $A_i$ and $C_i$, an ultrasound propagation lane $Z_{ib}$ existing between the finger-overlap zones $A_i$ and $C_{(i+1)}$. If an ultrasound on an ultrasound propagation lane $Z_{Xa}$ of the ultrasound propagation lanes $Z_{ia}$ attenuates by touching with a finger or others on the upper- or the lower end surface of the piezoelectric substrate, an electric signal $E_{Xb}$ corresponding to an ultrasound propagation lane $Z_{Xb}$ of the ultrasound propagation lanes $Z_{ib}$ is delivered at the output interdigital transducer, the ultrasound propagation lanes $Z_{Xa}$ and $Z_{Xb}$ making a pair. If the ultrasound on the ultrasound propagation lane $Z_{Xb}$ attenuates by touching on the upper- or the lower end surface of the piezoelectric substrate, an electric signal $E_{Xa}$ corresponding to the ultrasound propagation lane $Z_{Xa}$ is delivered at the output interdigital transducer. As a result, the choice of touch-positions on the upper- or the lower end surface of piezoelectric substrate gives the favorite output electric signal $E_{ia}$ or $E_{ib}$ at the output interdigital transducer. Thus, the ultrasonic switching device has a switching ability. If the electric signals $E_{ia}$ and $E_{ib}$ have radio frequencies, it is possible to radiate the electric signal $E_{ia}$ or $E_{ib}$ from the output interdigital transducer, causing a switching operation under remote control.

According to another aspect of the present invention there is provided a piezoelectric substrate made from piezoelectric ceramic.

According to another aspect of the present invention there is provided a condition that the interdigital periodicity P is larger than the thickness d of the piezoelectric substrate, and the polarization axis of the piezoelectric substrate is parallel to the direction of the thickness d. Under this condition, an elastic wave having the wavelength approximately equal to the interdigital periodicity P is excited in the piezoelectric substrate, when an electric signal having a frequency approximately corresponding to the interdigital periodicity P is applied to the input interdigital transducer. Accordingly, an electric signal is delivered at the output interdigital transducer by touching on the upper- or the lower end surface of the piezoelectric substrate.

According to other aspect of the present invention there is provided a condition that the interdigital periodicity P is smaller than one third of the thickness d of the piezoelectric substrate, and the polarization axis of the piezoelectric substrate is parallel to the direction of the thickness d. Under this condition, a surface acoustic wave having the wavelength approximately equal to the interdigital periodicity P is excited on the upper end surface, with the input- and output interdigital transducers, of the piezoelectric substrate, when an electric signal having a frequency approximately corresponding to the interdigital periodicity P is applied to the input interdigital transducer. Accordingly, an electric signal is delivered at the output interdigital transducer by touching on the upper end surface of the piezoelectric substrate.

According to a further aspect of the present invention there is provided a condition that the interdigital periodicity P is larger than the thickness d of the piezoelectric substrate, and the polarization axis of the piezoelectric substrate is parallel to the finger direction of the input interdigital transducer. Under this condition, an SH wave (shear horizontal wave) having the wavelength approximately equal to the interdigital periodicity P is excited in the piezoelectric substrate, when an electric signal having a frequency approximately corresponding to the interdigital periodicity P is applied to the input interdigital transducer. In addition, the SH wave is excited in the piezoelectric substrate along the vertical direction to the finger direction of the input interdigital transducer with at most three finger pairs, because that an SH wave has a displacement, of which direction is parallel to the upper- and the lower end surfaces of the piezoelectric substrate. Accordingly, an electric signal is delivered at the output interdigital transducer by touching on the upper- or the lower end surface of the piezoelectric substrate.

BRIEF DESCRIPTION OF THE DRAWINGS

Other features and advantages of the invention will be clarified from the following description with reference to the attached drawings.

DETAILED DESCRIPTION OF THE PRESENTLY PREFERRED EXEMPLARY EMBODIMENTS

Figure 1:
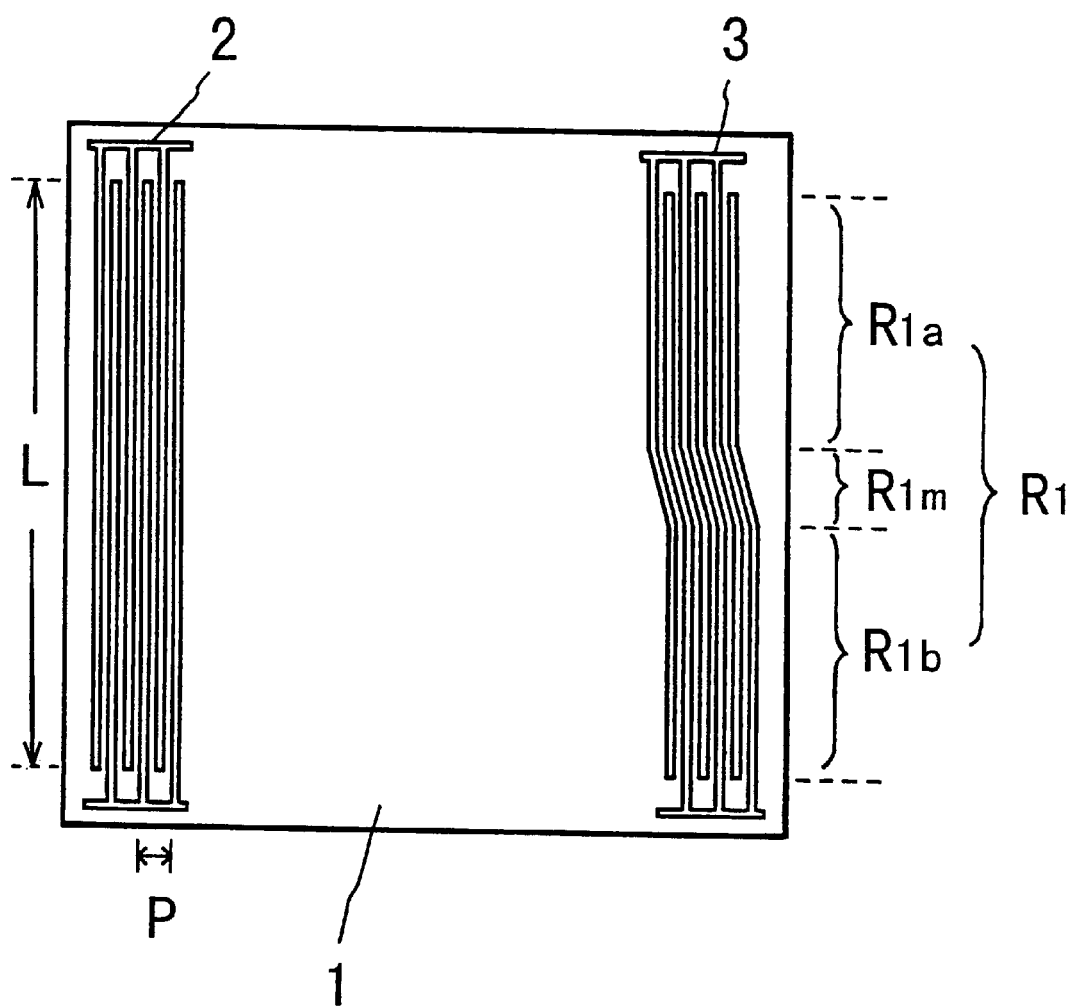
FIG. 1 shows a plan view of an ultrasonic switching device according to a first embodiment of the present invention.

FIG. 1 shows a plan view of an ultrasonic switching device according to a first embodiment of the present invention. The ultrasonic switching device comprises piezoelectric substrate 1 having an upper- and a lower end surfaces running perpendicular to the direction of the thickness d thereof, input interdigital transducer 2 made from aluminium thin film and formed on the upper end surface of piezoelectric substrate 1, and output interdigital transducer 3 made from aluminium thin film and formed on the upper end surface of piezoelectric substrate 1. Input interdigital transducer 2, having ten finger pairs, has an interdigital periodicity P of 1.7 mm and an overlap length L of 15 mm. Piezoelectric substrate 1 is made from a piezoelectric ceramic with a dimension of 1.5 mm in thickness. The polarization axis of piezoelectric substrate 1 is parallel to the direction of the thickness d thereof. Output interdigital transducer 3 with ten finger pairs has finger-overlap zone $R_1$ comprising first zone $R_{1a}$, second zone $R_{1b}$, and third zone $R_{1m}$ between zones $R_{1a}$ and $R_{1b}$. The finger direction of zones $R_{1a}$ and $R_{1b}$ runs parallel with that of input interdigital transducer 2. An interdigital periodicity of zones $R_{1a}$ and $R_{1b}$ is equal to the interdigital periodicity P.

Figure 2:
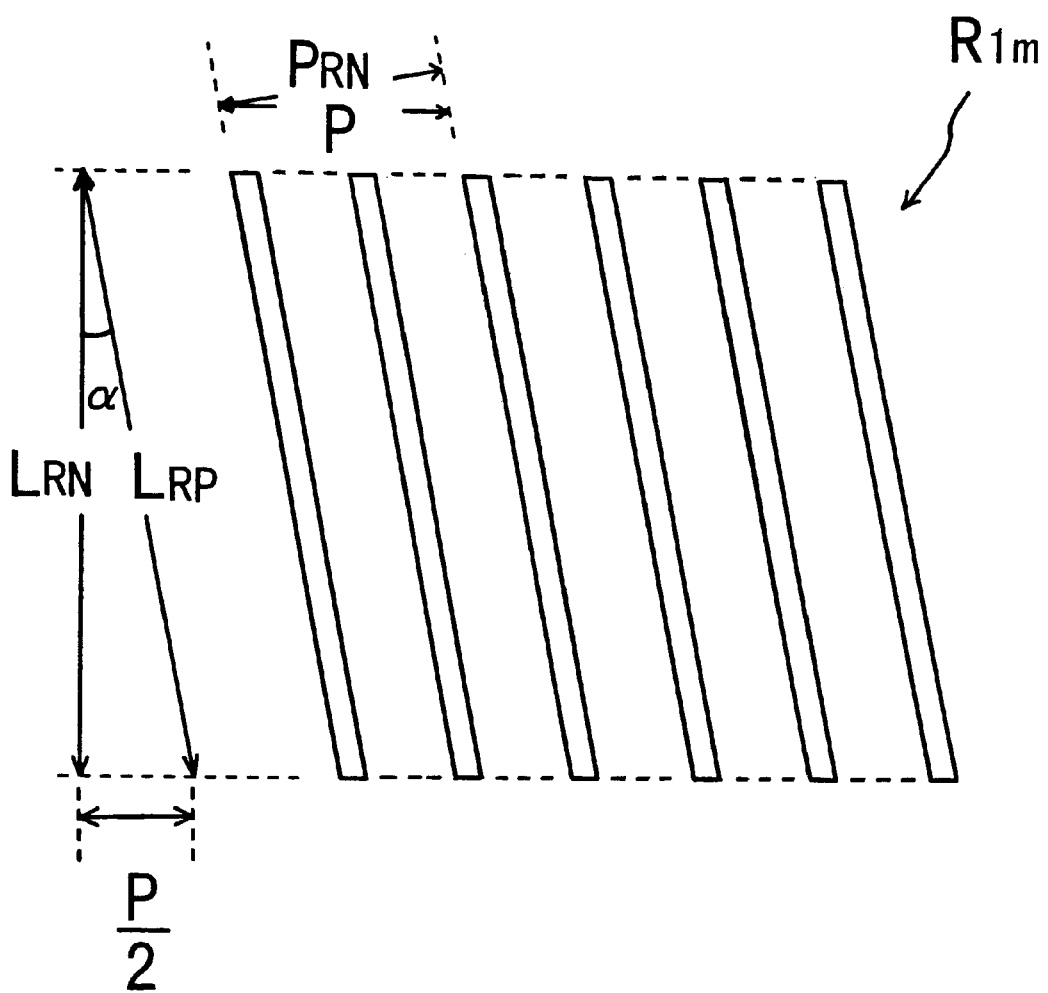
FIG. 2 shows a plan view, on an enlarged scale, of zone $R_{1m}$.

FIG. 2 shows a plan view, on an enlarged scale, of zone $R_{1m}$. The finger direction of zone $R_{1m}$ is slanting to that of input interdigital transducer 2 by an angle $\alpha$. An interdigital periodicity $P_{RN}$ along the vertical direction to the finger direction of zone $R_{1m}$ is equal to the product of the interdigital periodicity P and cos $\alpha$. Zone $R_{1m}$ has a first overlap length $L_{RP}$ along the finger direction thereof and a second overlap length $L_{RN}$ along the finger direction of input interdigital transducer 2. The overlap length $L_{RP}$ is equal to the product of the overlap length $L_{RN}$ and sec $\alpha$ as well as the product of half the interdigital periodicity P and cosec $\alpha$. The sum of the overlap length (7 mm) of zone $R_{1a}$, the overlap length (7 mm) of zone $R_{1b}$ and the overlap length $L_{RN}$ (1 mm) of zone $R_{1m}$ is equal to the overlap length L (15 mm).

Figure 3:
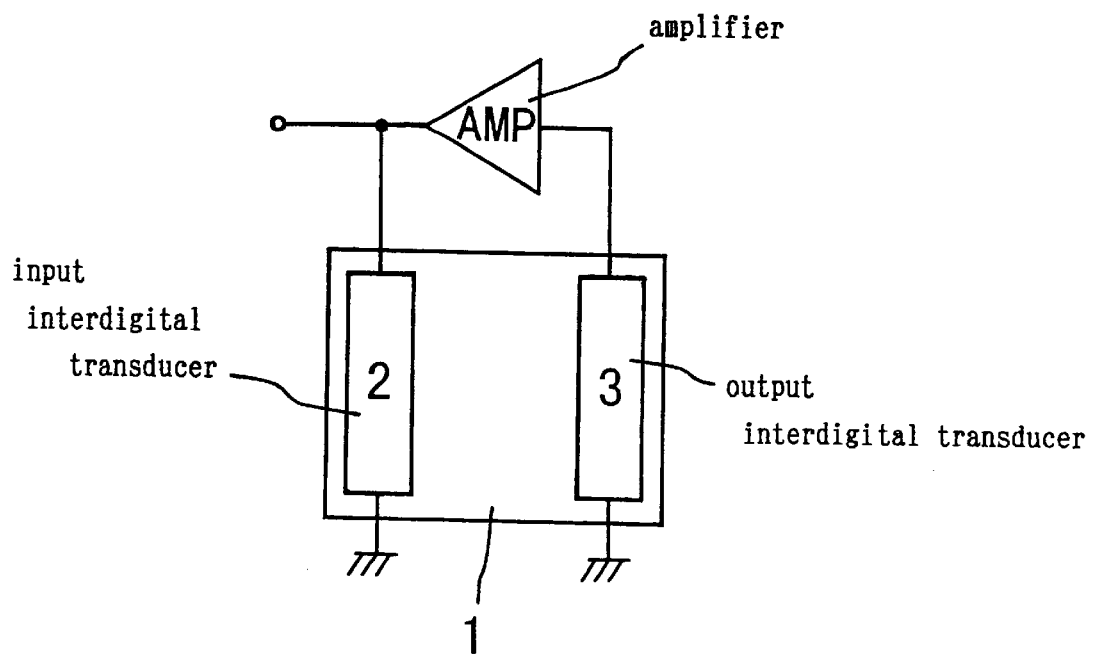
FIG. 3 shows a diagram of a circuit for the ultrasonic switching device in FIG. 1.

FIG. 3 shows a diagram of a circuit for the ultrasonic switching device in FIG. 1. The circuit includes amplifier AMP connected with an output terminal of output interdigital transducer 3. When an electric signal having a frequency approximately corresponding to the interdigital periodicity P is applied to input interdigital transducer 2, an elastic wave having the wavelength approximately equal to the interdigital periodicity P is excited in piezoelectric substrate 1. The elastic wave is transduced to electric signals $E_{1a}$ and $E_{1b}$ at zones $R_{1a}$ and $R_{1b}$, respectively. In this time, the sum of the electric signals $E_{1a}$ and $E_{1b}$ is zero, because that the overlap length $L_{RP}$ is equal to the product of the overlap length $L_{RN}$ and sec $\alpha$ as well as the product of P/2 and cosec $\alpha$. Input interdigital transducer 2 and output interdigital transducer 3 form two ultrasound propagation lanes $Z_{1a}$ and $Z_{1b}$, corresponding to zones $R_{1a}$ and $R_{1b}$, respectively, in piezoelectric substrate 1, ultrasound propagation lanes $Z_{1a}$ and $Z_{1b}$ making a pair. When the elastic wave on ultrasound propagation lane $Z_{1a}$ attenuates by touching with a finger or others on the upper- or the lower end surface of piezoelectric substrate 1, the electric signal $E_{1b}$ corresponding to ultrasound propagation lane $Z_{1b}$ is delivered at output interdigital transducer 3. In the same way, when the elastic wave on ultrasound propagation lane $Z_{1b}$ attenuates, the electric signal $E_{1a}$ is delivered at output interdigital transducer 3. As a result, the choice of touch-positions on the upper- or the lower end surface of piezoelectric substrate 1 gives the favorite output electric signal $E_{1b}$ or $E_{1a}$ at output interdigital transducer 3. Thus, the ultrasonic switching device has a switching ability. In addition, if the electric signals $E_{1b}$ and $E_{1a}$ have radio frequencies, it is possible to radiate the electric signal $E_{1b}$ or $E_{1a}$ from output interdigital transducer 3. The electric signal $E_1$ or $E_{1a}$ delivered at output interdigital transducer 3 is amplified via amplifier AMP, a part of the amplified electric signal being applied to input interdigital transducer 2 again. Thus, input interdigital transducer 2, output interdigital transducer 3, and amplifier AMP form an oscillator, causing not only a low voltage operation and low power consumption, but also a small-sized circuit with a simple structure.

Figure 4:
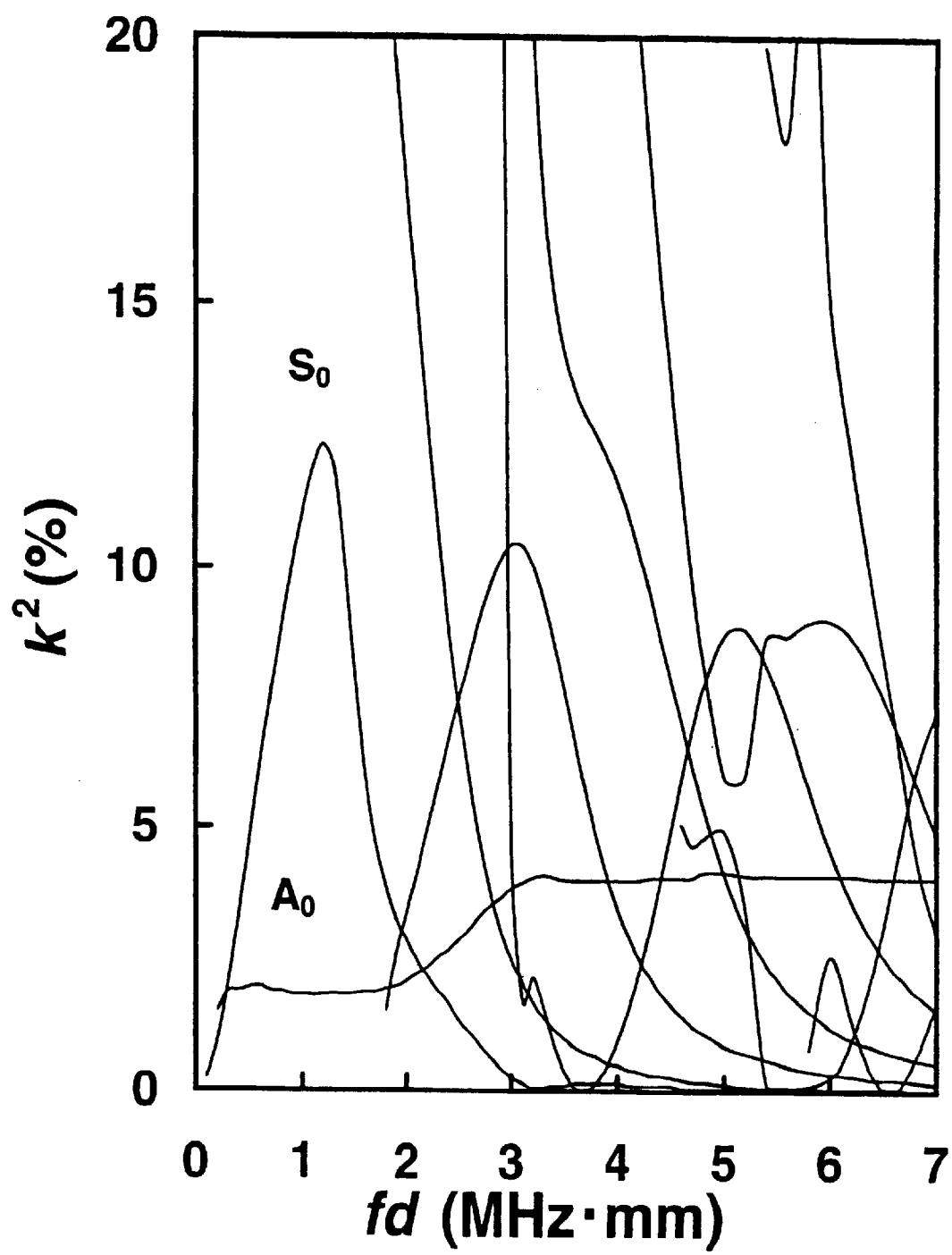
FIG. 4 shows a relationship between the $k^2$ value calculated from the difference between the phase velocity under electrically opened condition and that under electrically shorted condition of piezoelectric substrate 1, and the fd value.

FIG. 4 shows a relationship between the electromechanical coupling constant $k^2$ calculated from the difference between the phase velocity under electrically opened condition and that under electrically shorted condition of piezoelectric substrate 1, and the product fd of the frequency f of the elastic wave and the thickness d of piezoelectric substrate 1. Piezoelectric substrate 1 has a shear wave velocity of 2450 m/s traveling thereon alone, and a longitudinal wave velocity of 4390 m/s traveling thereon alone. For example, an electric energy applied to input interdigital transducer 2 is effectively transduced to the $S_o$ mode elastic wave when the fd value is approximately 1.3 MHz·mm, then the $k^2$ value is approximately 12.4% being the maximum value. It is clear that the $k^2$ value of 12.4% is worthy in comparison that a crystallized $LiNbO_3$ used as a popular piezoelectric substrate for exciting a surface acoustic wave has the $k^2$ value of approximately 5%.

Figure 5:
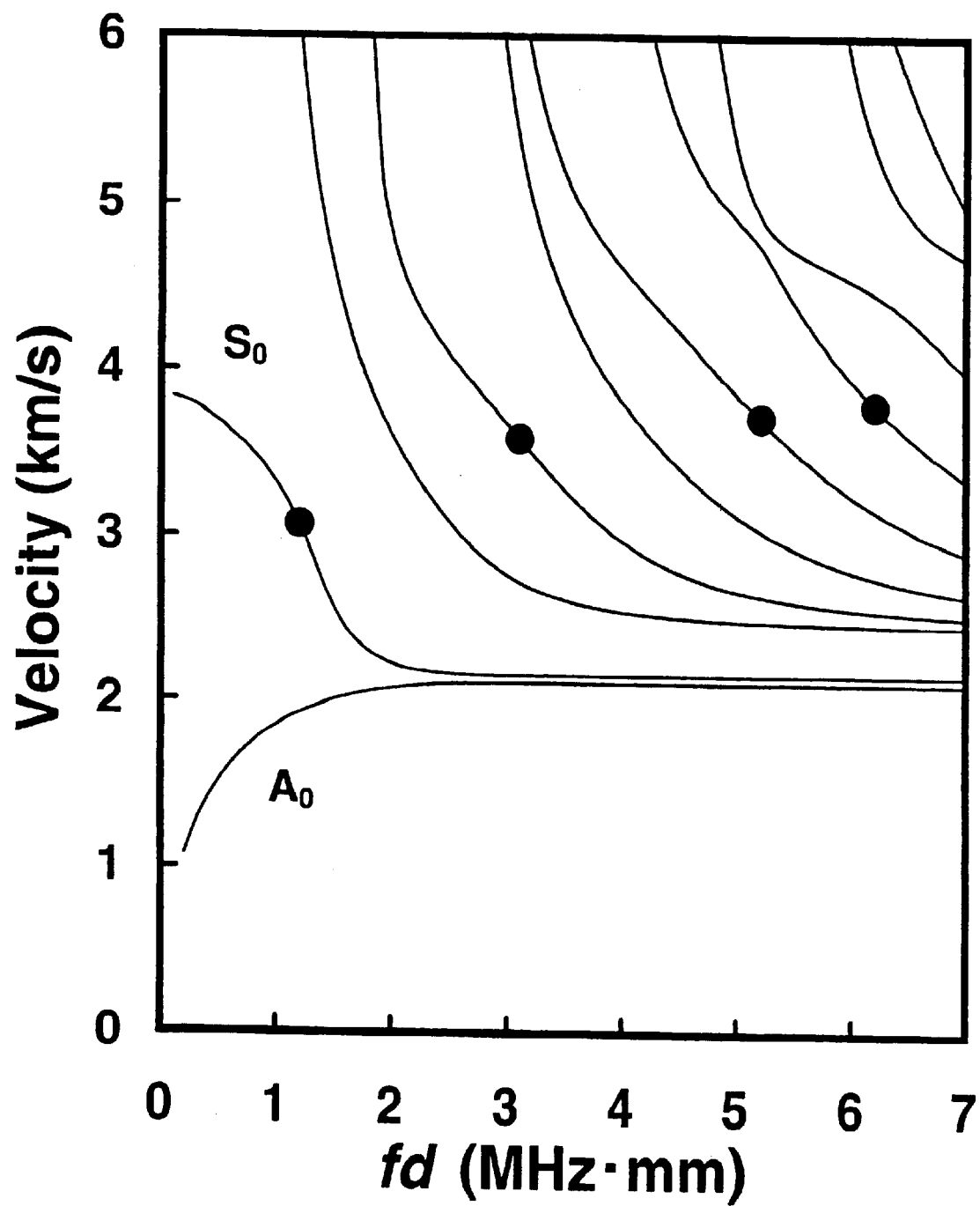
FIG. 5 shows a relationship between the phase velocity of the elastic wave for each mode in piezoelectric substrate 1, and the fd value.

FIG. 5 shows a relationship between the phase velocity of the elastic wave for each mode in piezoelectric substrate 1, and the fd value. The fd value at each mark ● has the maximum $k^2$ value where an electric energy applied to input interdigital transducer 2 is most effectively transduced to the elastic wave, the maximum $k^2$ value being obtained from FIG. 4. The phase velocity of the elastic wave at each mark ● is approximately 3500 m/s.

An ultrasonic switching device according to a second embodiment of the present invention has the same construction as that in FIG. 1, except for using of input interdigital transducer 4 and output interdigital transducer 5 in place of input interdigital transducer 2 and output interdigital transducer 3. Input interdigital transducer 4 has an interdigital periodicity P of 400 μm and an overlap length L of 15 mm. Input interdigital transducer 4 has the same construction as input interdigital transducer 2, except for the value of the interdigital periodicity P. Output interdigital transducer 5 has the same construction as output interdigital transducer 3, except for the value of the interdigital periodicity. The relative positions of input interdigital transducer 4 and output interdigital transducer 5 are substantially the same as those of input interdigital transducer 2 and output interdigital transducer 3. Thus, output interdigital transducer 5 has finger-overlap zone $R_1$ comprising zones $R_{1a}$, $R_{1b}$ and $R_{1m}$. The finger direction of zones $R_{1a}$ and $R_{1b}$ runs parallel with that of input interdigital transducer 4. An interdigital periodicity of zones $R_{1a}$ and $R_{1b}$ is equal to the interdigital periodicity P. On the other hand, the finger direction of zone $R_{1m}$ is slanting to that of input interdigital transducer 4 by an angle α. An interdigital periodicity $P_{RN}$ of zone $R_{1m}$ is equal to the product of the interdigital periodicity P and cos α. Zone $R_{1m}$ has two overlap lengths $L_{RP}$ and $L_{RN}$, the overlap length $L_{RP}$ being equal to the product of the overlap length $L_{RN}$ and sec α as well as the product of half the interdigital periodicity P and cosec α.

When operating the ultrasonic switching device according to the second embodiment, the circuit, in FIG. 3, except for using of input interdigital transducer 4 and output interdigital transducer 5 in place of input interdigital transducer 2 and output interdigital transducer 3, is available. If an electric signal having a frequency approximately corresponding to the interdigital periodicity P is applied to input interdigital transducer 4, a surface acoustic wave having the wavelength approximately equal to the interdigital periodicity P is excited on the upper end surface of piezoelectric substrate 1. The surface acoustic wave is transduced to electric signals $E_{1a}$ and $E_{1b}$, at zones $R_{1a}$ and $R_{1b}$, respectively. Input interdigital transducer 4 and output interdigital transducer 5 form two ultrasound propagation lanes $Z_{1a}$ and $Z_{1b}$ on the upper end surface of piezoelectric substrate 1, corresponding to zones $R_{1a}$ and $R_{1b}$, respectively. When the surface acoustic wave on ultrasound propagation lane $Z_1$ or $Z_{1b}$ attenuates by touching on the upper end surface of piezoelectric substrate 1, the corresponding electric signal $E_{1b}$ or $E_{1a}$ is delivered at output interdigital transducer 5, respectively. Thus, the ultrasonic switching device has a switching ability. In this time, if the electric signals $E_{1b}$ and $E_{1a}$ have radio frequencies, it is possible to radiate the electric signal $E_{1b}$ or $E_{1a}$ from output interdigital transducer 5.

An ultrasonic switching device according to a third embodiment of the present invention has the same construction as that in FIG. 1, except for using of piezoelectric substrate 6 in place of piezoelectric substrate 1, and using of input interdigital transducer 7 and output interdigital transducer 8 in place of input interdigital transducer 2 and output interdigital transducer 3. Both input interdigital transducer 7 and output interdigital transducer 8 have three finger pairs. Input interdigital transducer 7 has an interdigital periodicity P of 2.2 mm and an overlap length L of 15 mm. The polarization axis of piezoelectric substrate 6 is parallel to the finger direction of input interdigital transducer 7. Input interdigital transducer 7 has the same construction as input interdigital transducer 2, except for the value of the interdigital periodicity P and the number of finger pairs. Output interdigital transducer 8 has the same construction as output interdigital transducer 3, except for the value of the interdigital periodicity and the number of finger pairs. The relative positions of input interdigital transducer 7 and output interdigital transducer 8 are substantially the same as those of input interdigital transducer 2 and output interdigital transducer 3. Thus, output interdigital transducer 8 has finger-overlap zone $R_1$ comprising zones $R_{1a}$, $R_{1b}$ and $R_{1m}$. The finger direction of zones $R_{1a}$ and $R_{1b}$ runs parallel with that of input interdigital transducer 7. An interdigital periodicity of zones $R_{1a}$ and $R_{1b}$ is equal to the interdigital periodicity P. On the other hand, the finger direction of zone $R_{1m}$ is slanting to that of input interdigital transducer 7 by an angle α. An interdigital periodicity $P_{RN}$ of zone $R_{1m}$ is equal to the product of the interdigital periodicity P and cos α. Zone $R_{1m}$ has two overlap lengths $L_{RP}$ and $L_{RN}$, the overlap length $L_{RP}$ being equal to the product of the overlap length $L_{RN}$ and sec α as well as the product of half the interdigital periodicity P and cosec α.

When operating the ultrasonic switching device according to the third embodiment, the circuit, in FIG. 3, except for using of piezoelectric substrate 6 in place of piezoelectric substrate 1, and using of input interdigital transducer 7 and output interdigital transducer 8 in place of input interdigital transducer 2 and output interdigital transducer 3, is available. If an electric signal having a frequency approximately corresponding to the interdigital periodicity P is applied to input interdigital transducer 7, an SH wave having the wavelength approximately equal to the interdigital periodicity P is excited in piezoelectric substrate 6. The SH wave is transduced to electric signals $E_{1a}$ and $E_{1b}$, at zones $R_{1a}$ and $R_{1b}$, respectively. Input interdigital transducer 7 and output interdigital transducer 8 form two ultrasound propagation lanes $Z_{1a}$ and $Z_{1b}$ in piezoelectric substrate 6, corresponding to zones $R_{1a}$ and $R_{1b}$, respectively. When the SH wave on ultrasound propagation lane $Z_{1a}$ or $Z_{1b}$ attenuates by touching on the upper- or the lower end surface of piezoelectric substrate 6, the corresponding electric signal $E_{1b}$ or $E_{1a}$ is delivered at output interdigital transducer 8, respectively. Thus, the ultrasonic switching device has a switching ability. In this time, if the electric signals $E_{1b}$ and $E_{1a}$ have radio frequencies, it is possible to radiate the electric signal $E_{1b}$ or $E_{1a}$ from output interdigital transducer 8.

Figure 6:
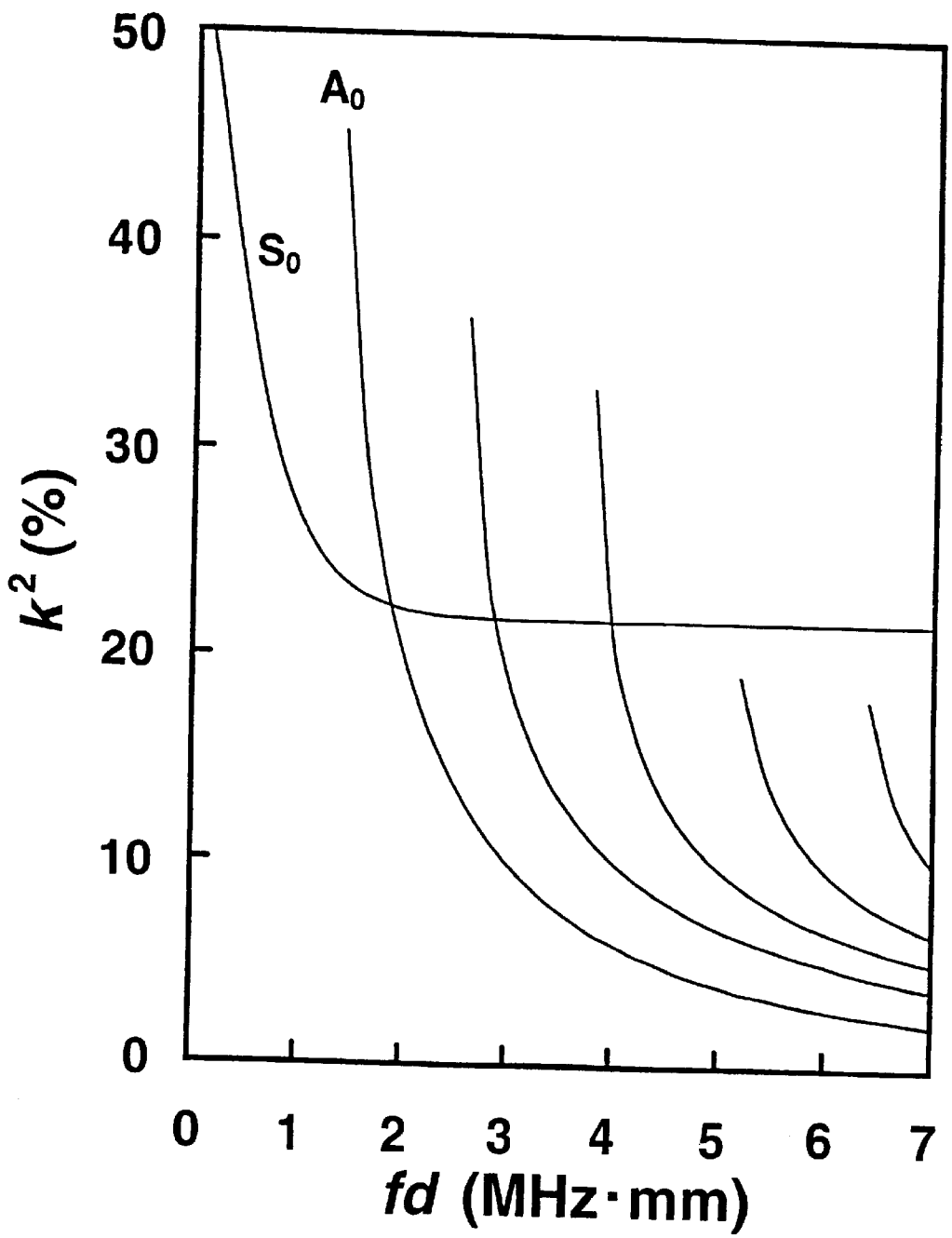
FIG. 6 shows a relationship between the $k^2$ value calculated from the difference between the phase velocity under electrically opened condition and that under electrically shorted condition of piezoelectric substrate 6, and the fd value.

FIG. 6 shows a relationship between the $k^2$ value calculated from the difference between the phase velocity under electrically opened condition and that under electrically shorted condition of piezoelectric substrate 6, and the product fd of the frequency f of the SH wave and the thickness d of piezoelectric substrate 6. Piezoelectric substrate 6 has a shear wave velocity of 2450 m/s traveling thereon alone. For example, an electric energy applied to input interdigital transducer 7 is effectively transduced to the $S_o$ mode SH wave when the fd value is approximately 1.5 MHz-mm and over, then the $k^2$ value is always over 22%.

Figure 7:
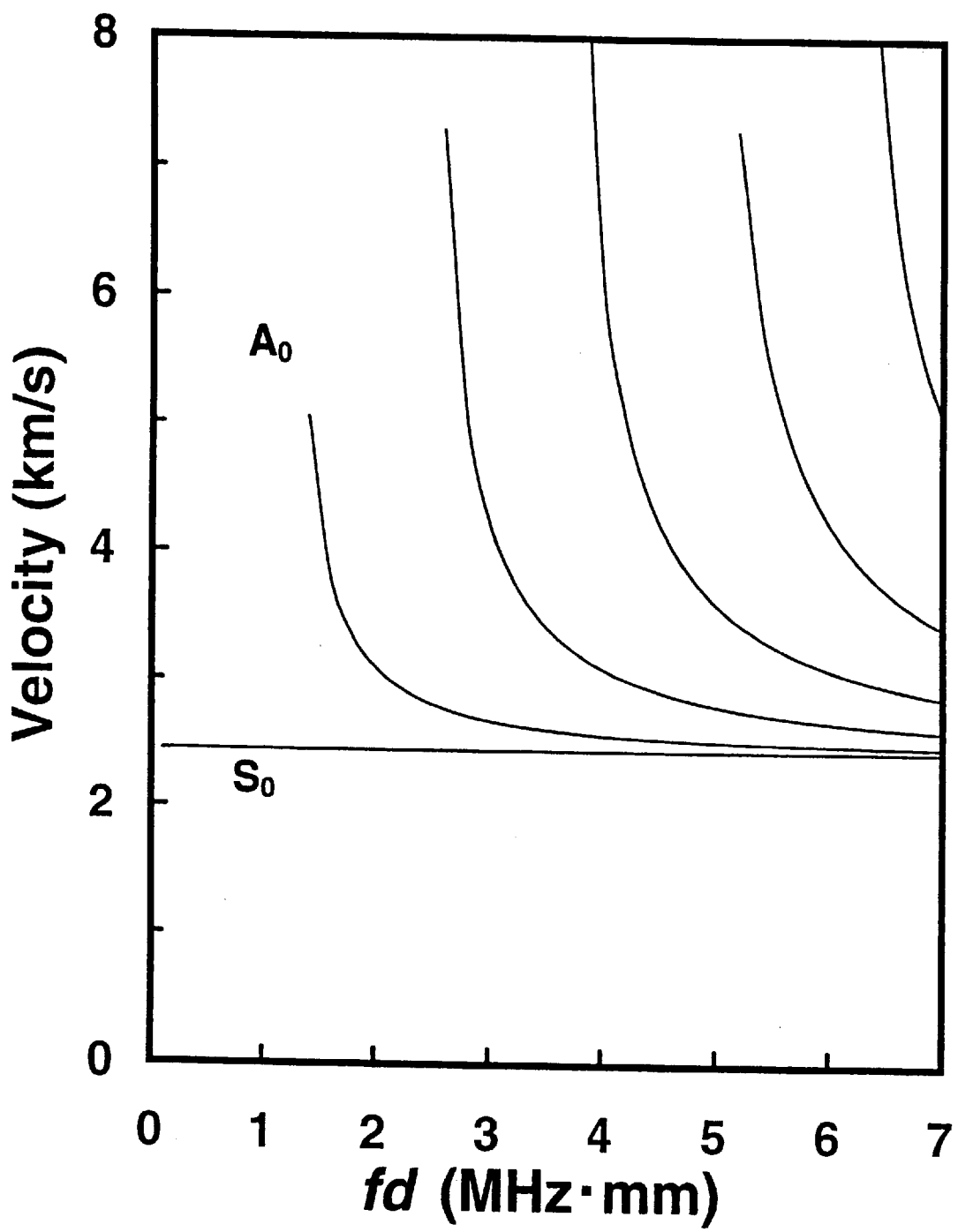
FIG. 7 shows a relationship between the phase velocity of the SH wave for each mode in piezoelectric substrate 6, and the fd value.
Figure 8:
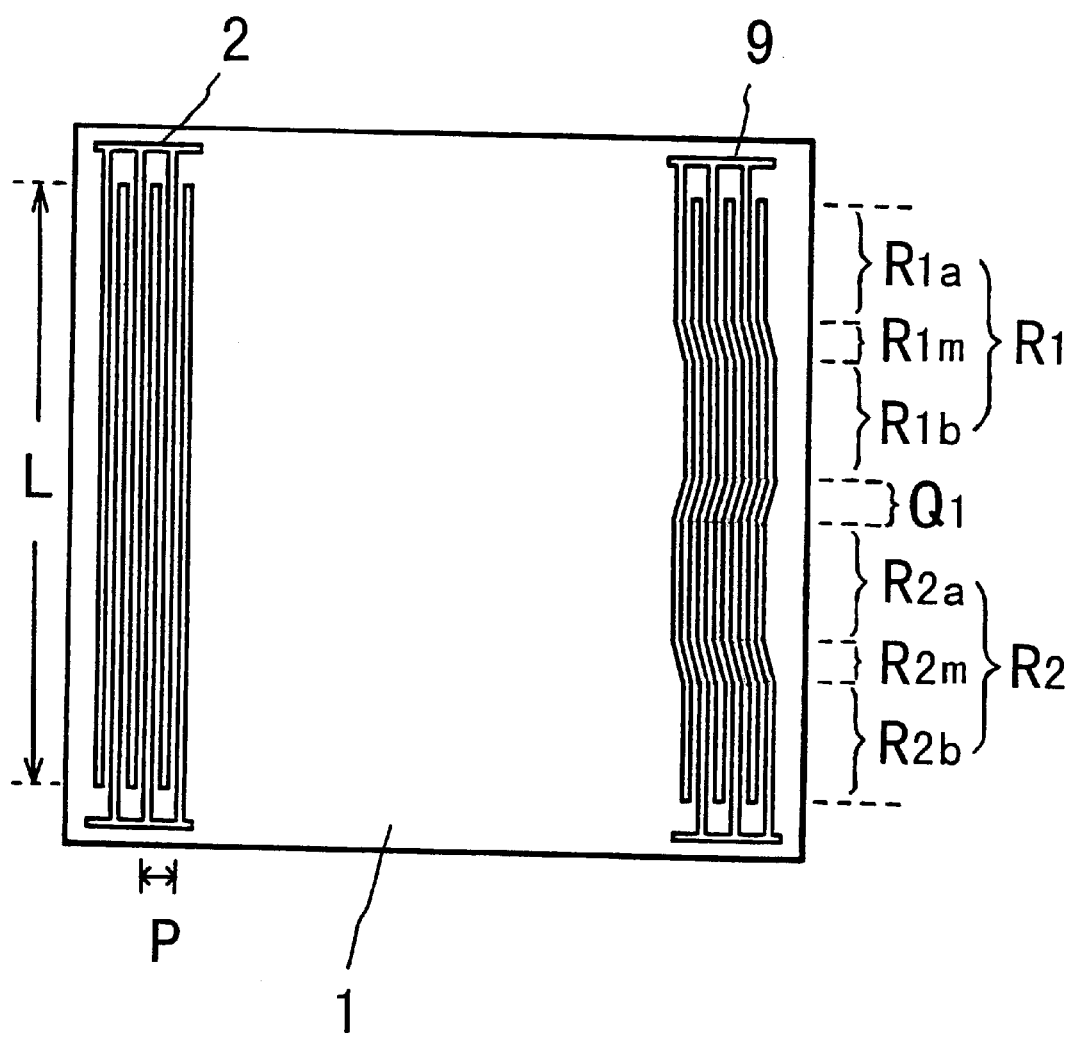
FIG. 8 shows a plan view of an ultrasonic switching device according to a fourth embodiment of the present invention.

FIG. 7 shows a relationship between the phase velocity of the SH wave for each mode in piezoelectric substrate 6, and the fd value. The phase velocity of the $S_o$ mode SH wave is substantially constant at any fd value in FIG. 7, the phase velocity being approximately equal to the shear wave velocity of 2450 m/s traveling on piezoelectric substrate 6 alone. FIG. 8 shows a plan view of an ultrasonic switching device according to a fourth embodiment of the present invention. The ultrasonic switching device has the same construction as that in FIG. 1, except for using of output interdigital transducer 9 in place of output interdigital transducer 3. Output interdigital transducer 9 with ten finger pairs has finger-overlap zones $R_1$ and $R_2$, and finger-overlap zone $Q_1$ between finger-overlap zones $R_1$ and $R_2$. In other words, output interdigital transducer 9 has N finger-overlap zones $R_i$ (i=1, 2, . . . , N) and N−1 finger-overlap zones $Q_i$ {i=1, 2, . . . , (N−1)} between two finger-overlap zones $R_i$ and $R_{(i+1)}$, then N is two. Finger-overlap zone $R_1$ comprises first zone $R_{1a}$, second zone $R_{1b}$, and third zone $R_{1m}$ between zones $R_{1a}$ and $R_{1b}$. Finger-overlap zone $R_2$ comprises first zone $R_{2a}$, second zone $R_{2b}$, and third zone $R_{2m}$ between zones $R_{2a}$ and $R_{2b}$. The finger direction of zones $R_{1a}$, $R_{1b}$, $R_{2a}$ and $R_{2b}$, runs parallel with that of input interdigital transducer 2. An interdigital periodicity of zones $R_{1a}$, $R_{1b}$, $R_{2a}$ and $R_{2b}$, is equal to the interdigital periodicity P. A structure of zone $R_{2m}$ is the same as that of zone $R_{1m}$, which is equivalent to zone $R_{1m}$ in FIG. 2.

Figure 9:
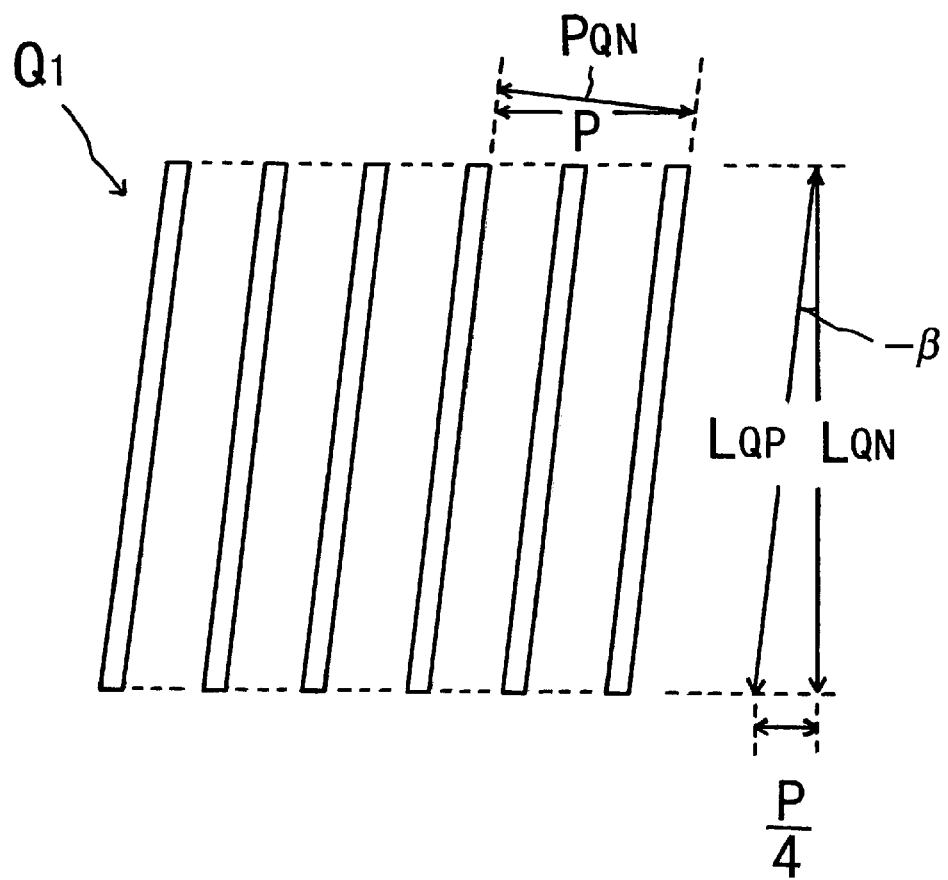
FIG. 9 shows a plan view, on an enlarged scale, of finger-overlap zone $Q_1$.

FIG. 9 shows a plan view, on an enlarged scale, of finger-overlap zone $Q_1$. The finger direction of finger-overlap zone $Q_1$ can be slanting to that of input interdigital transducer 2 by an angle $+\beta$ or $-\beta$, that is $\pm\beta$. However, in this embodiment, the finger direction of finger-overlap zone $Q_1$ is slanting to that of input interdigital transducer 2 by an angle $-\beta$. An interdigital periodicity $P_{QN}$ along the vertical direction to the finger direction of finger-overlap zone $Q_1$ is equal to the product of the interdigital periodicity P and cos $\beta$. Finger-overlap zone $Q_1$ has a first overlap length $L_{QP}$ along the finger direction thereof and a second overlap length $L_{QN}$ along the finger direction of input interdigital transducer 2. The overlap length $L_{QP}$ is equal to the product of the overlap length $L_{QN}$ and sec $\beta$. The overlap length $L_{QP}$ is also equal to the product of cosec $\beta$ and the interdigital periodicity P divided by 4, that is, the product of P/4 and cosec $\beta$. The sum of the overlap length (3 mm) of zone $R_{1a}$, the overlap length (3 mm) of zone $R_{1b}$, the overlap length (3 mm) of zone $R_{2a}$, the overlap length (3 mm) of zone $R_{2b}$, the overlap length $L_{RN}$ (1 mm) of zone $R_{1m}$, the overlap length $L_{RN}$ (1 mm) of zone $R_{2m}$, and the overlap length $L_{QN}$ (1 mm) of finger-overlap zone $Q_1$ is equal to the overlap length L (15 mm).

When operating the ultrasonic switching device according to the fourth embodiment, the circuit, in FIG. 3, except for using of output interdigital transducer 9 in place of output interdigital transducer 3, is available. If an electric signal having a frequency approximately corresponding to the interdigital periodicity P is applied to input interdigital transducer 2, an elastic wave having the wavelength approximately equal to the interdigital periodicity P is excited in piezoelectric substrate 1. The elastic wave is transduced to electric signals $E_{1a}$, $E_{1b}$, $E_{2a}$ and $E_{2b}$, at zones $R_{1a}$, $R_{1b}$, $R_{2a}$ and $R_{2b}$, respectively. In this time, the sum of the electric signals $E_{1a}$ and $E_{1b}$ is zero, and the sum of the electric signals $E_{2a}$ and $E_{2b}$ is zero, because that the overlap length $L_{RP}$ is equal to the product of the overlap length $L_{RN}$ and sec $\alpha$ as well as the product of P/2 and cosec $\alpha$. Input interdigital transducer 2 and output interdigital transducer 9 form four ultrasound propagation lanes $Z_{1a}$, $Z_{1b}$, $Z_{2a}$ and $Z_{2b}$, in piezoelectric substrate 1, corresponding to zones $R_{1a}$, $R_{1b}$, $R_{2a}$ and $R_{2b}$, respectively, ultrasound propagation lanes $Z_{1a}$ and $Z_{1b}$ making a pair, and ultrasound propagation lanes $Z_{2a}$ and $Z_{2b}$ making a pair. When the elastic wave on ultrasound propagation lane $Z_{1a}$ attenuates by touching on the upper- or the lower end surface of piezoelectric substrate 1, the electric signal $E_{1b}$ corresponding to ultrasound propagation lane $Z_{1b}$ is delivered at output interdigital transducer 9. Thus, when the elastic wave on ultrasound propagation lane $Z_{1a}$, $Z_{1b}$, $Z_{2a}$ or $Z_{2b}$ attenuates, the corresponding electric signal $E_{1b}$, $E_{1a}$, $E_{2b}$ or $E_{2a}$ is delivered at output interdigital transducer 9, respectively. As a result, the choice of touch-positions on the upper- or the lower end surface of piezoelectric substrate 1 gives the favorite output electric signal $E_{1b}$, $E_{1a, E2b}$ or $E_{2a}$, at output interdigital transducer 9. Thus, the ultrasonic switching device has a switching ability. In addition, if the electric signals $E_{1b}$, $E_{1a}$, $E_{2b}$ and $E_{2a}$ have radio frequencies, it is possible to radiate the electric signal $E_{1b}$, $E_{1a}$, $E_{2b}$ or $E_{2a}$ from output interdigital transducer 9.

An ultrasonic switching device according to a fifth embodiment of the present invention has the same construction as that in FIG. 8, except for using of input interdigital transducer 4 and output interdigital transducer 10 in place of input interdigital transducer 2 and output interdigital transducer 9. Output interdigital transducer 10 has the same construction as output interdigital transducer 9, except for the value of the interdigital periodicity. The relative positions of input interdigital transducer 4 and output interdigital transducer 10 are substantially the same as those of input interdigital transducer 2 and output interdigital transducer 9. Thus, output interdigital transducer 10, having ten finger pairs, has finger-overlap zones $R_1$, $R_2$ and $Q_1$. Finger-overlap zone $R_1$ comprises zones $R_{1a}$, $R_{1b}$ and $R_{1m}$. Finger-overlap zone $R_2$ comprises zones $R_{2a}$, $R_{2b}$ and $R_{2m}$. The finger direction of zones $R_{1a}$, $R_{1b}$, $R_{2a}$ and $R_{2b}$, runs parallel with that of input interdigital transducer 4. An interdigital periodicity of zones $R_{1a}$, $R_{1b}$, $R_{2a}$ and $R_{2b}$, is equal to the interdigital periodicity P. The finger direction of zones $R_{1m}$ and $R_{2m}$ is slanting to that of input interdigital transducer 4 by an angle $\alpha$. An interdigital periodicity $P_{RN}$ is equal to the product of the interdigital periodicity P and cos $\alpha$. Zone $R_{1m}$ has two overlap lengths $L_{RP}$ and $L_{RN}$. The overlap length $L_{RP}$ is equal to the product of the overlap length $L_{RN}$ and sec $\alpha$ as well as the product of half the interdigital periodicity P and cosec $\alpha$. The finger direction of finger-overlap zone $Q_i$ is slanting to that of input interdigital transducer 4 by an angle $-\beta$. An interdigital periodicity $P_{QN}$ is equal to the product of the interdigital periodicity P and cos $\beta$. Finger-overlap zone $Q_1$ has two overlap lengths $L_{QP}$ and $L_{QN}$. The overlap length $L_{QP}$ is not only equal to the product of the overlap length $L_{QN}$ and sec $\beta$, but also equal to the product of P/4 and cosec $\beta$.

When operating the ultrasonic switching device according to the fifth embodiment, the circuit, in FIG. 3, except for using of input interdigital transducer 4 and output interdigital transducer 10 in place of input interdigital transducer 2 and output interdigital transducer 3, is available. If an electric signal having a frequency approximately corresponding to the interdigital periodicity P is applied to input interdigital transducer 4, a surface acoustic wave having the wavelength approximately equal to the interdigital periodicity P is excited on the upper end surface of piezoelectric substrate 1. The surface acoustic wave is transduced to electric signals $E_{1a}$, $E_{1b}$, $E_{2a}$ and $E_{2b}$, at zones $R_{1a}$, $R_{1b}$, $R_{2a}$ and $R_{2b}$, respectively. Input interdigital transducer 4 and output interdigital transducer 10 form four ultrasound propagation lanes $Z_{1a}$, $Z_{1b}$, $Z_{2a}$ and $Z_{2b}$, on the upper end surface of piezoelectric substrate 1, corresponding to zones $R_{1a}$, $R_{1b}$, $R_{2a}$ and $R_{2b}$, respectively. When the surface acoustic wave on ultrasound propagation lane $Z_{1a}$, $Z_{1b}$, $Z_{2a}$ or $Z_{2b}$ attenuates by touching on the upper end surface of piezoelectric substrate 1, the corresponding electric signal $E_{1b}$, $E_{1a}$, $E_{2b}$ or $E_{2a}$ is delivered at output interdigital transducer 10, respectively. Thus, the ultrasonic switching device has a switching ability. In this time, if the electric signals $E_{1b}$, $E_{1a}$, $E_{2b}$ and $E_{2a}$ have radio frequencies, it is possible to radiate the electric signal $E_{1b}$, $E_{1a}$, $E_{2b}$ or $E_{2a}$ from output interdigital transducer 10.

An ultrasonic switching device according to a sixth embodiment of the present invention has the same construction as that in FIG. 8, except for using of piezoelectric substrate 6 in place of piezoelectric substrate 1, and using of input interdigital transducer 7 and output interdigital transducer 11 in place of input interdigital transducer 2 and output interdigital transducer 9. Output interdigital transducer 11 has the same construction as output interdigital transducer 9, except for the value of the interdigital periodicity and the number of finger pairs. The relative positions of input interdigital transducer 7 and output interdigital transducer 11 are substantially the same as those of input interdigital transducer 2 and output interdigital transducer 9. Thus, output interdigital transducer 11, having three finger pairs, has finger-overlap zones $R_1$, $R_2$ and $Q_1$. Finger-overlap zone $R_1$ comprises zones $R_{1a}$, $R_{1b}$ and $R_{1m}$. Finger-overlap zone $R_2$ comprises zones $R_{2a}$, $R_{2b}$ and $R_{2m}$. The finger direction of zones $R_{1a}$, $R_{1b}$, $R_{2a}$ and $R_{2b}$, runs parallel with that of input interdigital transducer 7. An interdigital periodicity of zones $R_{1a}$, $R_{1b}$, $R_{2a}$ and $R_{2b}$, is equal to the interdigital periodicity P. The finger direction of zones $R_{1m}$ and $R_{2m}$ is slanting to that of input interdigital transducer 7 by an angle $\alpha$. An interdigital periodicity $P_{RN}$ is equal to the product of the interdigital periodicity P and cos $\alpha$. Zone $R_{1m}$ has two overlap lengths $L_{RP}$ and $L_{RN}$. The overlap length $L_{RP}$ is equal to the product of the overlap length $L_{RN}$ and sec $\alpha$ as well as the product of half the interdigital periodicity P and cosec $\alpha$. The finger direction of finger-overlap zone $Q_1$ is slanting to that of input interdigital transducer 7 by an angle $-\beta$. An interdigital periodicity $P_{QN}$ is equal to the product of the interdigital periodicity P and cos $\beta$. Finger-overlap zone $Q_1$ has two overlap lengths $L_{QP}$ and $L_{QN}$. The overlap length $L_{QP}$ is not only equal to the product of the overlap length $L_{QN}$ and sec $\beta$, but also equal to the product of P/4 and cosec $\beta$.

When operating the ultrasonic switching device according to the sixth embodiment, the circuit, in FIG. 3, except for using of piezoelectric substrate 6 in place of piezoelectric substrate 1, and using of input interdigital transducer 7 and output interdigital transducer 11 in place of input interdigital transducer 2 and output interdigital transducer 3, is available. If an electric signal having a frequency approximately corresponding to the interdigital periodicity P is applied to input interdigital transducer 7, an SH wave having the wavelength approximately equal to the interdigital periodicity P is excited in piezoelectric substrate 6. The SH wave is transduced to electric signals $E_{1a}$, $E_{1b}$, $E_{2a}$ and $E_{2b}$, at zones $R_{1a}$, $R_{1b}$, $R_{2a}$ and $R_{2b}$, respectively. Input interdigital transducer 7 and output interdigital transducer 11 form four ultrasound propagation lanes $Z_{1a}$, $Z_{1b}$, $Z_{2a}$ and $Z_{2b}$, in piezoelectric substrate 6, corresponding to zones $R_{1a}$, $R_{1b}$, $R_{2a}$ and $R_{2b}$, respectively. When the SH wave on ultrasound propagation lane $Z_{1a}$, $Z_{1b}$, $Z_{2a}$ or $Z_{2b}$ attenuates by touching on the upper- or the lower end surface of piezoelectric substrate 6, the corresponding electric signal $E_{1b}$, $E_{1a}$, $E_{2b}$ or $E_{2a}$ is delivered at output interdigital transducer 11, respectively. Thus, the ultrasonic switching device has a switching ability. In this time, if the electric signals $E_{1b}$, $E_{1a}$, $E_{2b}$ and $E_{2a}$ have radio frequencies, it is possible to radiate the electric signal $E_{1b}$, $E_{1a}$, $E_{2b}$ or $E_{2a}$ from output interdigital transducer 11.

Figure 10:
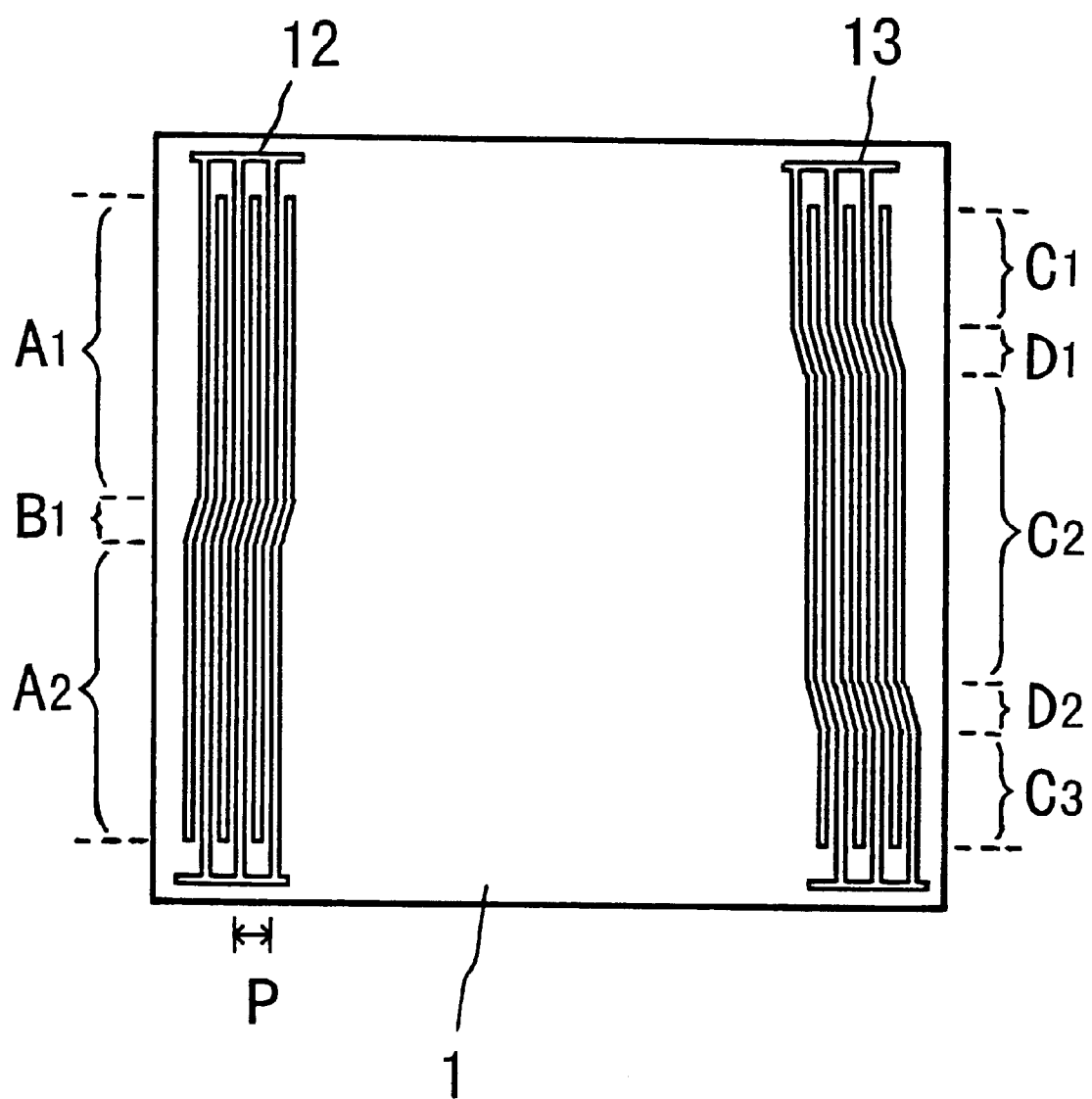
FIG. 10 shows a plan view of an ultrasonic switching device according to a seventh embodiment of the present invention.

FIG. 10 shows a plan view of an ultrasonic switching device according to a seventh embodiment of the present invention. The ultrasonic switching device has the same construction as that in FIG. 1, except for using of input interdigital transducer 12 and output interdigital transducer 13 in place of input interdigital transducer 2 and output interdigital transducer 3. Input interdigital transducer 12 with ten finger pairs has finger-overlap zones $A_1$ and $A_2$, and finger-overlap zone $B_1$ between finger-overlap zones $A_1$ and $A_2$. Output interdigital transducer 13 with ten finger pairs has finger-overlap zones $C_1$, $C_2$ and $C_3$, finger-overlap zone $D_1$ between finger-overlap zones $C_1$ and $C_2$, and finger-overlap zone $D_2$ between finger-overlap zones $C_2$ and $C_3$. In other words, input interdigital transducer 12 has N finger-overlap zones $A_i$ (i=1, 2, ..., N) and N−1 finger-overlap zones $B_i$ {i=1, 2, ..., (N−1)}, and output interdigital transducer 13 has N+1 finger-overlap zones $C_i$ {i=1, 2, ..., (N+1)} and N finger-overlap zones $D_i$ (i=1, 2, ..., N), then N is two. The finger direction of finger-overlap zones $A_1$ and $A_2$ runs parallel with that of finger-overlap zones $C_1$, $C_2$ and $C_3$. Each of finger-overlap zones $A_1$, $A_2$, $C_1$, $C_2$ and $C_3$ has an interdigital periodicity P of 1.7 mm.

Figure 11:
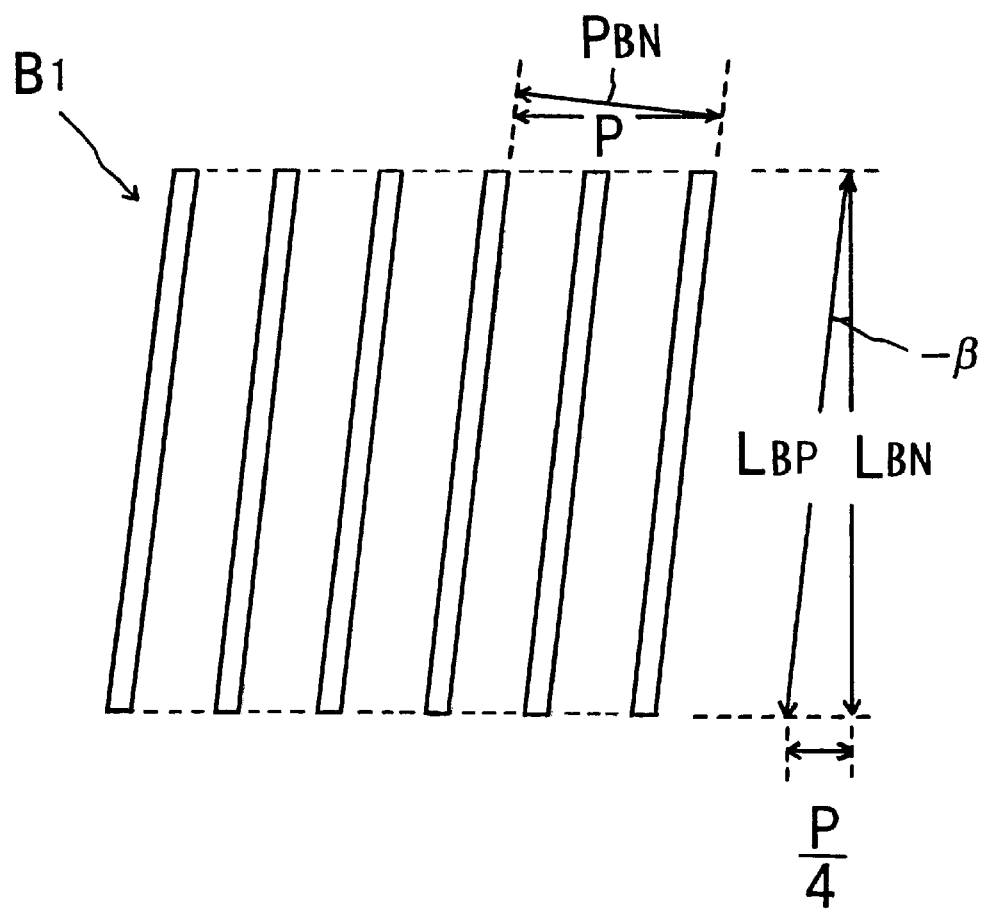
FIG. 11 shows a plan view, on an enlarged scale, of finger-overlap zone $B_1$.

FIG. 11 shows a plan view, on an enlarged scale, of finger-overlap zone $B_1$. The finger direction of finger-overlap zone $B_1$ is slanting to that of finger-overlap zones $A_1$ and $A_2$ by an angle $\beta$. An interdigital periodicity $P_{BN}$ along the vertical direction to the finger direction of finger-overlap zone $B_1$ is equal to the product of the interdigital periodicity P and cos $\beta$. Finger-overlap zone $B_1$ has a first overlap length $L_{BP}$ along the finger direction thereof and a second overlap length $L_{BN}$ along the finger direction of finger-overlap zones $A_1$ and $A_2$. The overlap length $L_{BP}$ is equal to the product of the overlap length $L_{BN}$ and sec $\beta$. The overlap length $L_{BP}$ is also equal to the product of cosec $\beta$ and the interdigital periodicity P divided by 4, that is, the product of P/4 and cosec $\beta$.

Figure 12:
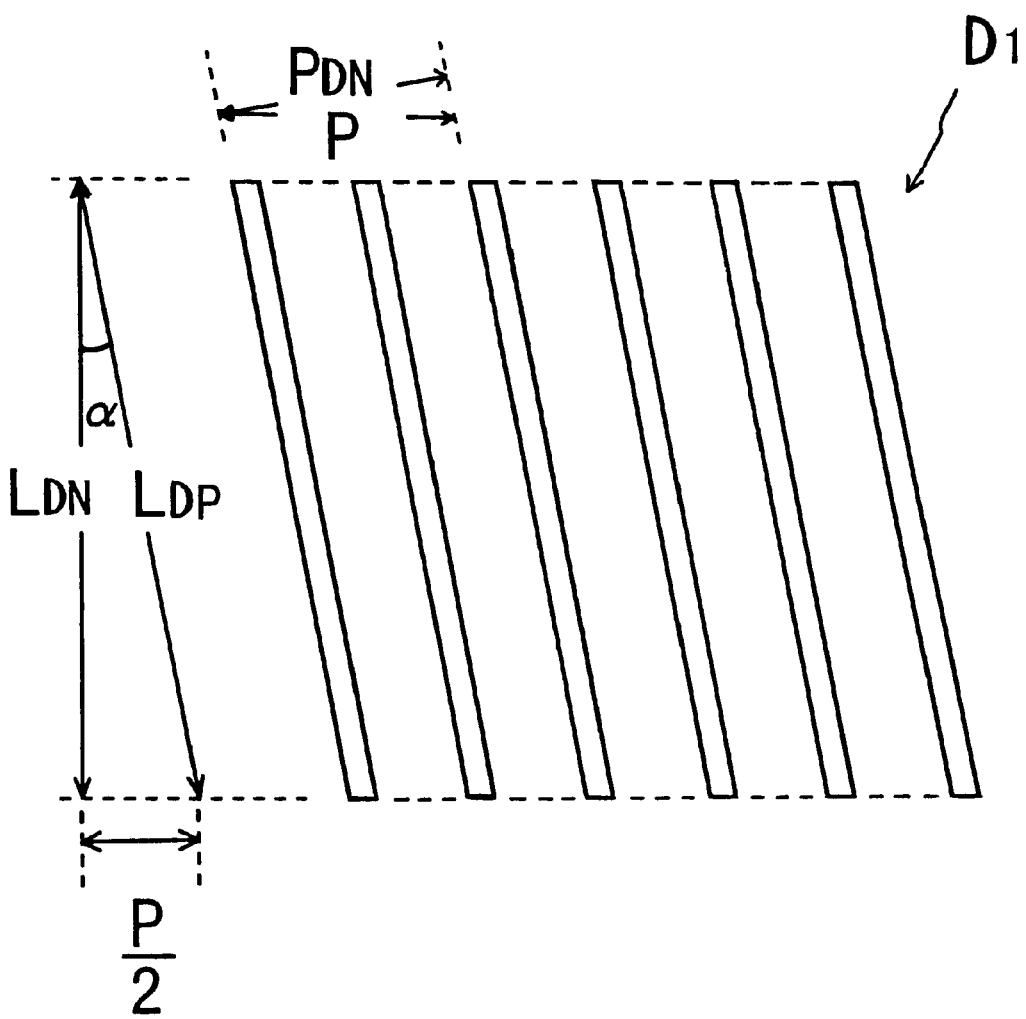
FIG. 12 shows a plan view, on an enlarged scale, of finger-overlap zone $D_1$.

FIG. 12 shows a plan view, on an enlarged scale, of finger-overlap zone $D_1$. Finger-overlap zone $D_2$ has the same construction as finger-overlap zone $D_1$. The finger direction of finger-overlap zones $D_1$ and $D_2$ is slanting to that of finger-overlap zones $C_1$, $C_2$ and $C_3$ by an angle $\alpha$. An interdigital periodicity $P_{DN}$ along the vertical direction to the finger direction of finger-overlap zone $D_1$ is equal to the product of the interdigital periodicity P and cos $\alpha$. Finger-overlap zone $D_1$ has a first overlap length $L_{DP}$ along the finger direction thereof and a second overlap length $L_{DN}$ along the finger direction of finger-overlap zones $C_1$, $C_2$ and $C_3$. The overlap length $L_{DP}$ is equal to the product of the overlap length $L_{DN}$ and sec $\alpha$. The overlap length $L_{DP}$ is also equal to the product of cosec $\alpha$ and the interdigital periodicity P divided by 2, that is, the product of P/2 and cosec $\alpha$. The sum of the overlap length (7 mm) of finger-overlap zone $A_1$, the overlap length (7 mm) of finger-overlap zone $A_2$ and the overlap length $L_{BN}$ (1 mm) of finger-overlap zone $B_1$ is equal to the sum of the overlap length (3 mm) of finger-overlap zone $C_1$, the overlap length (3 mm) of finger-overlap zone $C_3$, the overlap length (7 mm) of finger-overlap zone $C_2$, the overlap length $L_{DN}$ (1 mm) of finger-overlap zone $D_1$ and the overlap length $L_{DN}$ (1 mm) of finger-overlap zone $D_2$.

When operating the ultrasonic switching device according to the seventh embodiment, the circuit, in FIG. 3, except for using of input interdigital transducer 12 and output interdigital transducer 13 in place of input interdigital transducer 2 and output interdigital transducer 3, is available. If an electric signal having a frequency approximately corresponding to the interdigital periodicity P is applied to input interdigital transducer 12, an elastic wave having the wavelength approximately equal to the interdigital periodicity P is excited in piezoelectric substrate 1. The elastic wave is transduced to two electric signals $E_{1a}$ and $E_{2a}$, and two electric signals $E_{1b}$ and $E_{2b}$ at output interdigital transducer 13. In this time, the sum of the electric signals $E_{1a}$ and $E_{1b}$ is zero, and the sum of the electric signals $E_{2a}$ and $E_{2b}$ is zero, because that the overlap length $L_{DP}$ is equal to the product of the overlap length $L_{DN}$ and sec $\alpha$ as well as the product of P/2 and cosec $\alpha$. Input interdigital transducer 12 and output interdigital transducer 13 form two ultrasound propagation lanes $Z_{1a}$ and $Z_{2a}$, and two ultrasound propagation lanes $Z_{1b}$ and $Z_{2b}$, in piezoelectric substrate 1, ultrasound propagation lane $Z_{1b}$ existing between finger-overlap zones $A_1$ and $C_1$, ultrasound propagation lane $Z_{1b}$ existing between finger-overlap zones $A_1$ and $C_2$, ultrasound propagation lane $Z_{2a}$ existing between finger-overlap zones $A_2$ and $C_2$, ultrasound propagation lane $Z_{2b}$ existing between finger-overlap zones $A_2$ and $C_3$. When the elastic wave on ultrasound propagation lane $Z_{1b}$ attenuates by touching on the upper- or the lower end surface of piezoelectric substrate 1, the electric signal $E_{1a}$ corresponding to ultrasound propagation lane $Z_{1a}$ is delivered at output interdigital transducer 13. Thus, when the elastic wave on ultrasound propagation lane $Z_{1a}$, $Z_{1b}$, $Z_{2a}$ or $Z_{2b}$ attenuates, the corresponding electric signal $E_{1b}$, $E_{1a}$, $E_{2b}$ or $E_{2a}$ is delivered at output interdigital transducer 13, respectively. In this time, a weak electric signal transduced from the elastic wave at each of finger-overlap zones $D_1$ and $D_2$ is not delivered at output interdigital transducer 13, whether touching on ultrasound propagation lane $Z_{1a}$, $Z_{1b}$, $Z_{2a}$ or $Z_{2b}$, or not. As a result, the choice of touch-positions on the upper- or the lower end surface of piezoelectric substrate 1 gives the favorite output electric signal $E_{1b}$, $E_{1a}$, $E_{2b}$ or $E_{2a}$, at output interdigital transducer 13. Thus, the ultrasonic switching device has a switching ability. In addition, if the electric signals $E_{1b}$, $E_{1a}$, $E_{2b}$ and $E_{2a}$ have radio frequencies, it is possible to radiate the electric signal $E_{1b}$, $E_{1a}$, $E_{2b}$ or $E_{2a}$ from output interdigital transducer 13.

An ultrasonic switching device according to an eighth embodiment of the present invention has the same construction as that in FIG. 10, except for using of input interdigital transducer 14 and output interdigital transducer 15 in place of input interdigital transducer 12 and output interdigital transducer 13. Input interdigital transducer 14 has the same construction as input interdigital transducer 12, except for the value of the interdigital periodicity. Output interdigital transducer 15 has the same construction as output interdigital transducer 13, except for the value of the interdigital periodicity. The relative positions of input interdigital transducer 14 and output interdigital transducer 15 are substantially the same as those of input interdigital transducer 12 and output interdigital transducer 13. Thus, input interdigital transducer 14 has finger-overlap zones $A_1$, $A_2$, and $B_1$, and output interdigital transducer 15 has finger-overlap zones $C_1$, $C_2$, $C_3$, $D_1$ and $D_2$. The finger direction of finger-overlap zones $A_1$ and $A_2$ runs parallel with that of finger-overlap zones $C_1$, $C_2$ and $C_3$. Each of finger-overlap zones $A_1$, $A_2$, $C_1$, $C_2$ and $C_3$ has an interdigital periodicity P of 400 μm. The finger direction of finger-overlap zone $B_1$ is slanting to that of finger-overlap zones $A_1$ and $A_2$ by an angle $-\beta$. An interdigital periodicity $P_{BN}$ of finger-overlap zone $B_1$ is equal to the product of the interdigital periodicity P and cos β. Finger-overlap zone $B_1$ has two overlap lengths $L_{BP}$ and $L_{BN}$. The overlap length $L_{BP}$ is not only equal to the product of the overlap length $L_{BN}$ and sec β, but also equal to the product of P/4 and cosec β. The finger direction of finger-overlap zones $D_1$ and $D_2$ is slanting to that of finger-overlap zones $C_1$, $C_2$ and $C_3$ by an angle α. An interdigital periodicity $P_{DN}$ of finger-overlap zone $D_1$ is equal to the product of the interdigital periodicity P and cos α. Finger-overlap zone $D_1$ has two overlap lengths $L_{DP}$ and $L_{DN}$. The overlap length $L_{DP}$ is not only equal to the product of the overlap length $L_{DN}$ and sec α, but also equal to the product of P/2 and cosec α.

When operating the ultrasonic switching device according to the eighth embodiment, the circuit, in FIG. 3, except for using of input interdigital transducer 14 and output interdigital transducer 15 in place of input interdigital transducer 2 and output interdigital transducer 3, is available. If an electric signal having a frequency approximately corresponding to the interdigital periodicity P is applied to input interdigital transducer 14, a surface acoustic wave having the wavelength approximately equal to the interdigital periodicity P is excited on the upper end surface of piezoelectric substrate 1. The surface acoustic wave is transduced to two electric signals $E_{1a}$ and $E_{2a}$, and two electric signals $E_{1b}$ and $E_{2b}$ at output interdigital transducer 15. Input interdigital transducer 14 and output interdigital transducer 15 form two ultrasound propagation lanes $Z_{1a}$ and $Z_{2a}$ and two ultrasound propagation lanes $Z_{1b}$ and $Z_{2b}$, on the upper end surface of piezoelectric substrate 1. When the surface acoustic wave on ultrasound propagation lane $Z_{1a}$, $Z_{1b}$, $Z_{2a}$ or $Z_{2b}$ attenuates by touching on the upper end surface of piezoelectric substrate 1, the corresponding electric signal $E_{1b}$, $E_{1a}$, $E_{2b}$ or $E_{2a}$ is delivered at output interdigital transducer 15, respectively. Thus, the ultrasonic switching device has a switching ability. In addition, if the electric signals $E_{1b}$, $E_{1a}$, $E_{2b}$ and $E_{2a}$ have radio frequencies, it is possible to radiate the electric signal $E_{1b}$, $E_{1a}$, $E_{2b}$ or $E_{2a}$ from output interdigital transducer 15.

An ultrasonic switching device according to a ninth embodiment of the present invention has the same construction as that in FIG. 10, except for using of piezoelectric substrate 6 in place of piezoelectric substrate 1, and using of input interdigital transducer 16 and output interdigital transducer 17 in place of input interdigital transducer 12 and output interdigital transducer 13. Input interdigital transducer 16 has the same construction as input interdigital transducer 12, except for the value of the interdigital periodicity and the number of finger pairs. Output interdigital transducer 17 has the same construction as output interdigital transducer 13, except for the value of the interdigital periodicity and the number of finger pairs. Both input interdigital transducer 16 and output interdigital transducer 17 have three finger pairs. The relative positions of input interdigital transducer 16 and output interdigital transducer 17 are substantially the same as those of input interdigital transducer 12 and output interdigital transducer 13. Thus, input interdigital transducer 16 has finger-overlap zones $A_1$, $A_2$, and $B_1$, and output interdigital transducer 17 has finger-overlap zones $C_1$, $C_2$, $C_3$, $D_1$ and $D_2$. The finger direction of finger-overlap zones $A_1$ and $A_2$ runs parallel with that of finger-overlap zones $C_1$, $C_2$ and $C_3$. Each of finger-overlap zones $A_1$, $A_2$, $C_1$, $C_2$ and $C_3$ has an interdigital periodicity P of 2.2 mm. The finger direction of finger-overlap zone $B_1$ is slanting to that of finger-overlap zones $A_1$ and $A_2$ by an angle $-\beta$. An interdigital periodicity $P_{BN}$ of finger-overlap zone $B_1$ is equal to the product of the interdigital periodicity P and cos β. Finger-overlap zone $B_1$ has two overlap lengths $L_{BP}$ and $L_{BN}$. The overlap length $L_{BP}$ is not only equal to the product of the overlap length $L_{BN}$ and sec β, but also equal to the product of P/4 and cosec β. The finger direction of finger-overlap zones $D_1$ and $D_2$ is slanting to that of finger-overlap zones $C_1$, $C_2$ and $C_3$ by an angle α. An interdigital periodicity $P_{DN}$ of finger-overlap zone $D_1$ is equal to the product of the interdigital periodicity P and cos α. Finger-overlap zone $D_1$ has two overlap lengths $L_{DP}$ and $L_{DN}$. The overlap length $L_{DP}$ is not only equal to the product of the overlap length $L_{DN}$ and sec α, but also equal to the product of P/2 and cosec α.

When operating the ultrasonic switching device according to the ninth embodiment, the circuit, in FIG. 3, except for using of piezoelectric substrate 6 in place of piezoelectric substrate 1, and using of input interdigital transducer 16 and output interdigital transducer 17 in place of input interdigital transducer 2 and output interdigital transducer 3, is available. If an electric signal having a frequency approximately corresponding to the interdigital periodicity P is applied to input interdigital transducer 16, an SH wave having the wavelength approximately equal to the interdigital periodicity P is excited in piezoelectric substrate 6. The SH wave is transduced to two electric signals $E_{1a}$ and $E_{2a}$, and two electric signals $E_{1b}$ and $E_{2b}$ at output interdigital transducer 17. Input interdigital transducer 16 and output interdigital transducer 17 form two ultrasound propagation lanes $Z_{1a}$ and $Z_{2a}$, and two ultrasound propagation lanes $Z_{1b}$ and $Z_{2b}$, in piezoelectric substrate 6. When the SH wave on ultrasound propagation lane $Z_{1a}$, $Z_{1b}$, $Z_{2a}$ or $Z_{2b}$ attenuates by touching on the upper- or the lower end surface of piezoelectric substrate 6, the corresponding electric signal $E_{1b}$, $E_{1a}$, $E_{2b}$ or $E_{2a}$ is delivered at output interdigital transducer 17, respectively. Thus, the ultrasonic switching device has a switching ability. In this time, if the electric signals $E_{1b}$, $E_{1a}$, $E_{2b}$ and $E_{2a}$ have radio frequencies, it is possible to radiate the electric signal $E_{1b}$, $E_{1a}$, $E_{2b}$ or $E_{2a}$ from output interdigital transducer 17.

While this invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

What is claimed is:

1. An ultrasonic switching device comprising:

a piezoelectric substrate having an upper- and a lower end surfaces running perpendicular to the direction of the thickness d thereof;

an input interdigital transducer formed on said upper end surface of said piezoelectric substrate and having an interdigital periodicity P and an overlap length L; and an output interdigital transducer formed on said upper end surface of said piezoelectric substrate, said output interdigital transducer having a finger-overlap zone $R_i$ (i=1), or having N finger-overlap zones $R_i$ (i=1, 2, ..., N) and N−1 finger-overlap zones $Q_i$ {i=1, 2, ..., (N−1)} between two finger-overlap zones $R_i$ and $R_{(i+1)}$, each finger-overlap zone $R_i$ comprising a first zone $R_{ia}$, a second zone $R_{ib}$, and a third zone $R_{im}$ between said zones $R_{ia}$ and $R_{ib}$, the finger direction of said zones $R_{ia}$ and $R_{ib}$ running parallel with that of said input interdigital transducer, an interdigital periodicity of said zones $R_{ia}$ and $R_{ib}$ being equal to said interdigital periodicity P, the finger direction of said zone $R_{im}$ being slanting to that of said input interdigital transducer by an angle $\alpha$, an interdigital periodicity $P_{RN}$ along the vertical direction to the finger direction of said zone $R_{im}$ being equal to the product of said interdigital periodicity P and cos $\alpha$, said zone $R_{im}$ having a first overlap length $L_{RP}$ along the finger direction thereof and a second overlap length $L_{RN}$ along the finger direction of said input interdigital transducer, said overlap length $L_{RP}$ being equal to the product of said overlap length $L_{RN}$ and sec $\alpha$ as well as the product of half said interdigital periodicity P and cosec $\alpha$, the finger direction of said finger-overlap zone $Q_i$ being slanting to that of said input interdigital transducer by an angle $\pm\beta$, an interdigital periodicity $P_{QN}$ along the vertical direction to the finger direction of said finger-overlap zone $Q_i$ being equal to the product of said interdigital periodicity P and cos $\beta$, said finger-overlap zone $Q_i$ having a first overlap length $L_{QP}$ along the finger direction thereof and a second overlap length $L_{QN}$ along the finger direction of said input interdigital transducer, said overlap length $L_{QP}$ being equal to the product of said overlap length $L_{QN}$ and sec $\beta$, said input interdigital transducer receiving an electric signal and exciting an ultrasound in said piezoelectric substrate, said zones $R_{ia}$ and $R_{ib}$ transducing said ultrasound to electric signals $E_{ia}$ and $E_{ib}$ (i=1, 2, ..., N), respectively, the sum of said electric signals $E_{ia}$ and $E_{ib}$ being zero, said input- and output interdigital transducers forming N pairs of ultrasound propagation lanes $Z_{ia}$ and $Z_{ib}$ (i=1, 2, ..., N), in said piezoelectric substrate, corresponding to said zones $R_{ia}$ and $R_{ib}$, respectively, said output interdigital transducer delivering an electric signal $E_{Xb}$ corresponding to an ultrasound propagation lane $Z_{Xb}$ only when an ultrasound on an ultrasound propagation lane $Z_{Xa}$ attenuates by touching with a finger or others on said upper- or said lower end surface of said piezoelectric substrate, or delivering an electric signal $E_{Xa}$ corresponding to said ultrasound propagation lane $Z_{Xa}$ only when an ultrasound on said ultrasound propagation lane $Z_{Xb}$ attenuates by touching on said upper- or said lower end surface of said piezoelectric substrate, said ultrasound propagation lanes $Z_{Xa}$ and $E_{Xb}$ making a pair.

2. An ultrasonic switching device as defined in claim 1, wherein said overlap length $L_{QP}$ is equal to the product of cosec $\beta$ and said interdigital periodicity P divided by twice the number N of said finger-overlap zones $R_i$.

3. An ultrasonic switching device as defined in claim 1, wherein said interdigital periodicity P is larger than said thickness d of said piezoelectric substrate, and the polarization axis of said piezoelectric substrate is parallel to the direction of said thickness d, said input interdigital transducer receiving an electric signal with a frequency approximately corresponding to said interdigital periodicity P and exciting an elastic wave having the wavelength approximately equal to said interdigital periodicity P in said piezoelectric substrate.

4. An ultrasonic switching device as defined in claim 1, wherein said interdigital periodicity P is smaller than one third of said thickness d of said piezoelectric substrate, and the polarization axis of said piezoelectric substrate is parallel to the direction of said thickness d, said input interdigital transducer receiving an electric signal with a frequency approximately corresponding to said interdigital periodicity P and exciting a surface acoustic wave having the wavelength approximately equal to said interdigital periodicity P on said upper end surface of said piezoelectric substrate.

5. An ultrasonic switching device as defined in claim 1, wherein said interdigital periodicity P is larger than said thickness d of said piezoelectric substrate, and the polarization axis of said piezoelectric substrate is parallel to the finger direction of said input interdigital transducer, said input interdigital transducer receiving an electric signal with a frequency approximately corresponding to said interdigital periodicity P and exciting an SH wave having the wavelength approximately equal to said interdigital periodicity P in said piezoelectric substrate.

6. An ultrasonic switching device as defined in claim 1, wherein said piezoelectric substrate is made of a piezoelectric ceramic.

7. An ultrasonic switching device as defined in claim 1, wherein said electric signals $E_{ia}$ and $E_{ib}$ have radio frequencies.

8. An ultrasonic switching device comprising:

a piezoelectric substrate having an upper- and a lower end surfaces running perpendicular to the direction of the thickness d thereof;

an input interdigital transducer formed on said upper end surface of said piezoelectric substrate and having N finger-overlap zones $A_i$ (i=1, 2, . . . , N) and N−1 finger-overlap zones $B_i$ {i=1, 2, . . . , (N−1)} between two finger-overlap zones $A_i$ and $A_{(i+1)}$; and an output interdigital transducer formed on said upper end surface of said piezoelectric substrate and having N+1 finger-overlap zones $C_i$ {i=1, 2, . . . , (N+1)} and N finger-overlap zones $D_i$ (i=1, 2, . . . , N) between two finger-overlap zones $C_i$ and $C_{(i+1)}$, the finger direction of said finger-overlap zones $A_i$ running parallel with that of said finger-overlap zones $C_i$, the finger direction of said finger-overlap zones $B_i$ being slanting to that of said finger-overlap zones $A_i$ by an angle $-\beta$, an interdigital periodicity $P_{BN}$ along the vertical direction to the finger direction of said finger-overlap zones $B_i$ being equal to the product of $\cos \beta$ and an interdigital periodicity P of said finger-overlap zones $A_i$ and $C_i$, each finger-overlap zone $B_i$ having a first overlap length $L_{BP}$ along the finger direction thereof and a second overlap length $L_{BN}$ along the finger direction of said finger-overlap zones $A_i$, said overlap length $L_{BP}$ being equal to the product of sec $\beta$ and said overlap length $L_{BN}$, the finger direction of said finger-overlap zones $D_i$ being slanting to that of said finger-overlap zones $C_i$ by an angle $\alpha$, an interdigital periodicity $P_{DN}$ along the vertical direction to the finger direction of said finger-overlap zones $D_i$ being equal to the product of $\cos \alpha$ and said interdigital periodicity P, each finger-overlap zone $D_i$ having a first overlap length $L_{DP}$ along the finger direction thereof and a second overlap length $L_{DN}$ along the finger direction of said finger-overlap zones $C_i$, said overlap length $L_{DP}$ being equal to the product of sec $\alpha$ and said overlap length $L_{DN}$ as well as the product of half said interdigital periodicity P and cosec $\alpha$, said input interdigital transducer receiving an electric signal and exciting an ultrasound in said piezoelectric substrate, said output interdigital transducer transducing said ultrasound to N electric signals $E_{ia}$ (i=1, 2, . . . , N) and N electric signals $E_{ib}$ (i=1, 2, . . . , N), respectively, the sum of said electric signals $E_{ia}$ and $E_{ib}$ being zero, said input- and output interdigital transducers forming N pairs of ultrasound propagation lanes $Z_{ia}$ and $Z_{ib}$ (i=1, 2, . . . , N) in said piezoelectric substrate, an ultrasound propagation lane $Z_{ia}$ existing between said finger-overlap zones $A_i$ and $C_i$, an ultrasound propagation lane $Z_{ib}$ existing between said finger-overlap zones $A_i$ and $C_{(i+1)}$, said output interdigital transducer delivering an electric signal $E_{Xb}$ corresponding to an ultrasound propagation lane $Z_{Xb}$ only when an ultrasound on an ultrasound propagation lane $Z_{Xa}$ attenuates by touching with a finger or others on said upper- or said lower end surface of said piezoelectric substrate, or delivering an electric signal $E_{Xa}$ corresponding to said ultrasound propagation lane $Z_{Xa}$ only when an ultrasound on said ultrasound propagation lane $Z_{Xb}$ attenuates by touching on said upper- or said lower end surface of said piezoelectric substrate, said ultrasound propagation lanes $Z_{Xa}$ and $E_{Xb}$ making a pair.

9. An ultrasonic switching device as defined in claim 8, wherein said overlap length $L_{BP}$ is equal to the product of cosec $\beta$ and said interdigital periodicity P divided by twice the number N of said finger-overlap zones $A_i$.

10. An ultrasonic switching device as defined in claim 8, wherein said interdigital periodicity P is larger than said thickness d of said piezoelectric substrate, and the polarization axis of said piezoelectric substrate is parallel to the direction of said thickness d, said input interdigital transducer receiving an electric signal with a frequency approximately corresponding to said interdigital periodicity P and exciting an elastic wave having the wavelength approximately equal to said interdigital periodicity P in said piezoelectric substrate.

11. An ultrasonic switching device as defined in claim 8, wherein said interdigital periodicity P is smaller than one third of said thickness d of said piezoelectric substrate, and the polarization axis of said piezoelectric substrate is parallel to the direction of said thickness d, said input interdigital transducer receiving an electric signal with a frequency approximately corresponding to said interdigital periodicity P and exciting a surface acoustic wave having the wavelength approximately equal to said interdigital periodicity P on said upper end surface of said piezoelectric substrate.

12. An ultrasonic switching device as defined in claim 8, wherein said interdigital periodicity P is larger than said thickness d of said piezoelectric substrate, and the polarization axis of said piezoelectric substrate is parallel to the finger direction of said input interdigital transducer, said input interdigital transducer receiving an electric signal with a frequency approximately corresponding to said interdigital periodicity P and exciting an SH wave having the wavelength approximately equal to said interdigital periodicity P in said piezoelectric substrate.

13. An ultrasonic switching device as defined in claim 8, wherein said piezoelectric substrate is made of a piezoelectric ceramic.

14. An ultrasonic switching device as defined in claim 8, wherein said electric signals $E_{ia}$ and $E_{ib}$ have radio frequencies.

* * * * *